United States Patent
Suzuki et al.

(10) Patent No.: US 9,033,248 B2
(45) Date of Patent: May 19, 2015

(54) SEMICONDUCTOR STORAGE DEVICE

(75) Inventors: Hidetoshi Suzuki, Kawasaki (JP);
Yuichi Hotta, Yokohama (JP); Yuji Shimoda, Yokkaichi (JP); Yuuji Ogawa, Yokkaichi (JP); Taku Nishiyama, Yokohama (JP); Tadanobu Okubo, Yokkaichi (JP); Junichi Onodera, Yokohama (JP); Takeshi Ikuta, Yokohama (JP); Naohisa Okumura, Kamakura (JP); Katsuyoshi Watanabe, Fujisawa (JP); Kazuhide Doi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 28 days.

(21) Appl. No.: 13/553,997

(22) Filed: Jul. 20, 2012

(65) Prior Publication Data
US 2013/0186960 A1 Jul. 25, 2013

(30) Foreign Application Priority Data

Jul. 20, 2011 (JP) .................................. 2011-159291

(51) Int. Cl.
*G06K 19/06* (2006.01)
*H01L 23/28* (2006.01)
(Continued)

(52) U.S. Cl.
CPC .......... *G06K 19/07732* (2013.01); *H01L 24/49* (2013.01); *H01L 2224/4809* (2013.01);
(Continued)

(58) Field of Classification Search
CPC ............. H01L 2224/4826; H01L 2224/48145; H01L 2224/73215; H01L 2224/92147; H01L 23/4951; H01L 23/538; H01L 24/80; H01L 25/0657

USPC .................. 235/492; 257/679, 787; 324/754; 438/108, 128

See application file for complete search history.

(56) References Cited

U.S. PATENT DOCUMENTS

2005/0148217 A1* 7/2005 Takiar et al. ................. 439/76.1
2007/0096265 A1* 5/2007 Wallace ....................... 257/666
(Continued)

FOREIGN PATENT DOCUMENTS

CN 1696972 A 11/2005
CN 1918581 A 2/2007
(Continued)

OTHER PUBLICATIONS

Office Action issued Jun. 10, 2014 in Japanese Patent Application No. 2011-159291 (with English language translation).
(Continued)

*Primary Examiner* — Thien M Le
*Assistant Examiner* — Claude J Brown
(74) *Attorney, Agent, or Firm* — Oblon, McClelland, Maier & Neustadt, L.L.P.

(57) ABSTRACT

According to one embodiment, a semiconductor storage device is provided with a memory chip including a storage circuit, a controller chip that controls a memory chip, and a substrate having a first surface and a second surface opposing one another, on the first surface of which the controller chip is mounted. Further, the semiconductor storage device is provided with an external connection terminal formed on the second surface of the substrate, and resin that encapsulates the memory chip, the controller chip, and the substrate, includes a third surface and a fourth surface opposing one another, and has a predetermined mark directly printed only on the fourth surface that is adjacent to the second surface of the substrate.

6 Claims, 26 Drawing Sheets

(51) Int. Cl.
*G06K 19/077* (2006.01)
*H01L 23/00* (2006.01)
*H01L 23/31* (2006.01)
*H01L 23/544* (2006.01)
*H01L 25/065* (2006.01)
*H01L 25/18* (2006.01)
*H01L 25/16* (2006.01)
*H01L 23/498* (2006.01)

(52) U.S. Cl.
CPC ............ *H01L2224/49113* (2013.01); *H01L 2224/49171* (2013.01); *H01L 2224/73265* (2013.01); *H01L 2924/19107* (2013.01); *H01L 23/3107* (2013.01); *H01L 23/544* (2013.01); *H01L 2223/54406* (2013.01); *H01L 2223/54433* (2013.01); *H01L 2223/54486* (2013.01); *H01L 25/0655* (2013.01); *H01L 25/165* (2013.01); *H01L 25/18* (2013.01); *H01L 23/49838* (2013.01); *H01L 23/49855* (2013.01)

(56) References Cited

U.S. PATENT DOCUMENTS

| | | | |
|---|---|---|---|
| 2007/0132111 A1* | 6/2007 | Lien | 257/787 |
| 2007/0257346 A1* | 11/2007 | Tanigawa et al. | 257/679 |
| 2008/0007932 A1 | 1/2008 | Tung et al. | |
| 2008/0081455 A1* | 4/2008 | Yu et al. | 438/612 |
| 2008/0191030 A1* | 8/2008 | Ma et al. | 235/492 |
| 2008/0237848 A1* | 10/2008 | Yoshikawa et al. | 257/723 |
| 2009/0004776 A1* | 1/2009 | Ye et al. | 438/108 |
| 2009/0004785 A1* | 1/2009 | Chiu et al. | 438/127 |
| 2009/0134502 A1* | 5/2009 | Takiar et al. | 257/666 |
| 2009/0153163 A1* | 6/2009 | Han et al. | 324/754 |
| 2010/0007014 A1* | 1/2010 | Suzuki et al. | 257/723 |
| 2010/0084762 A1* | 4/2010 | Nishikawa et al. | 257/723 |
| 2011/0198740 A1 | 8/2011 | Matsushima | |

FOREIGN PATENT DOCUMENTS

| | | |
|---|---|---|
| CN | 101055912 A | 10/2007 |
| JP | 2005-322109 A | 11/2005 |
| JP | 2005-353713 A | 12/2005 |
| JP | 2008-16004 | 1/2008 |

OTHER PUBLICATIONS

Office Action issued Aug. 1, 2014 in Chinese Patent Application No. 201210253477.1 (with English language translation).

* cited by examiner

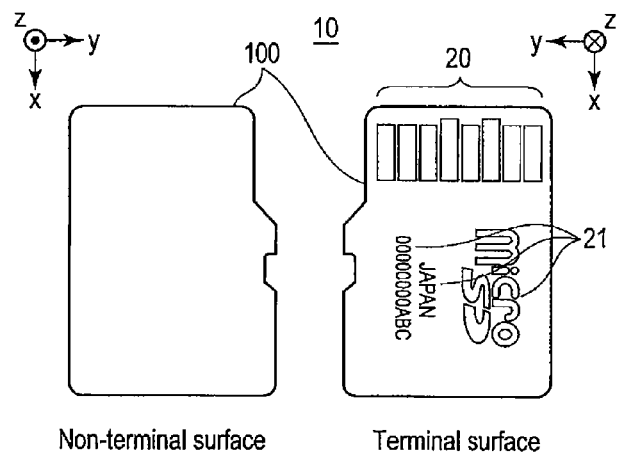
Non-terminal surface    Terminal surface
F I G. 1
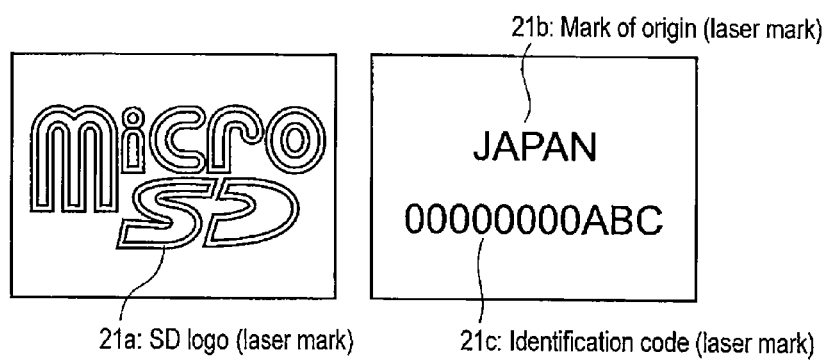
F I G. 2

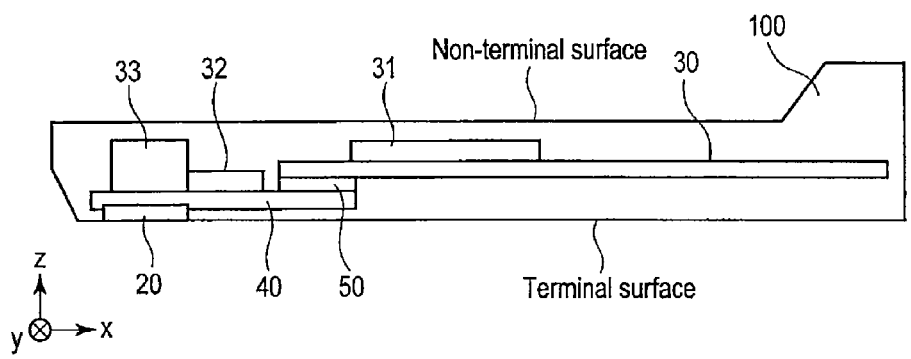
F I G. 3
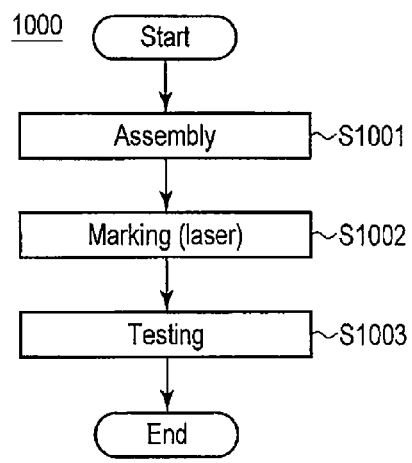
F I G. 4

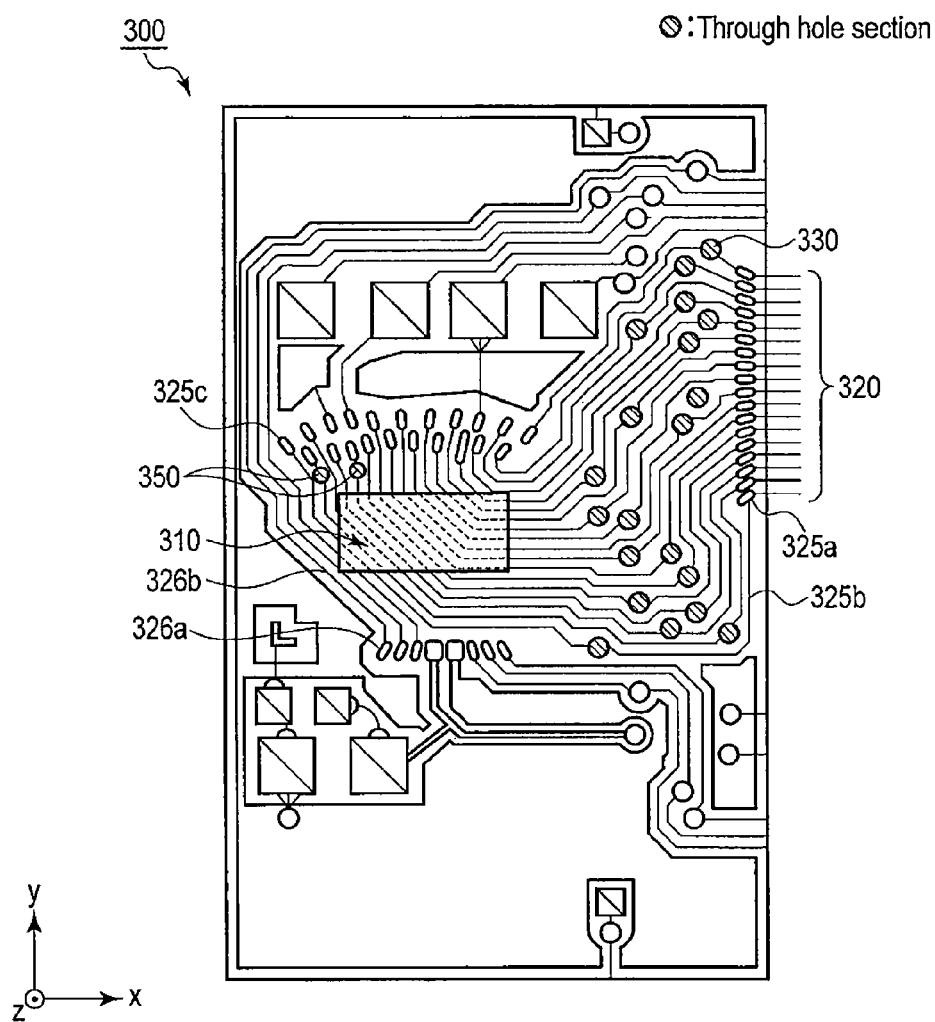
F I G. 10

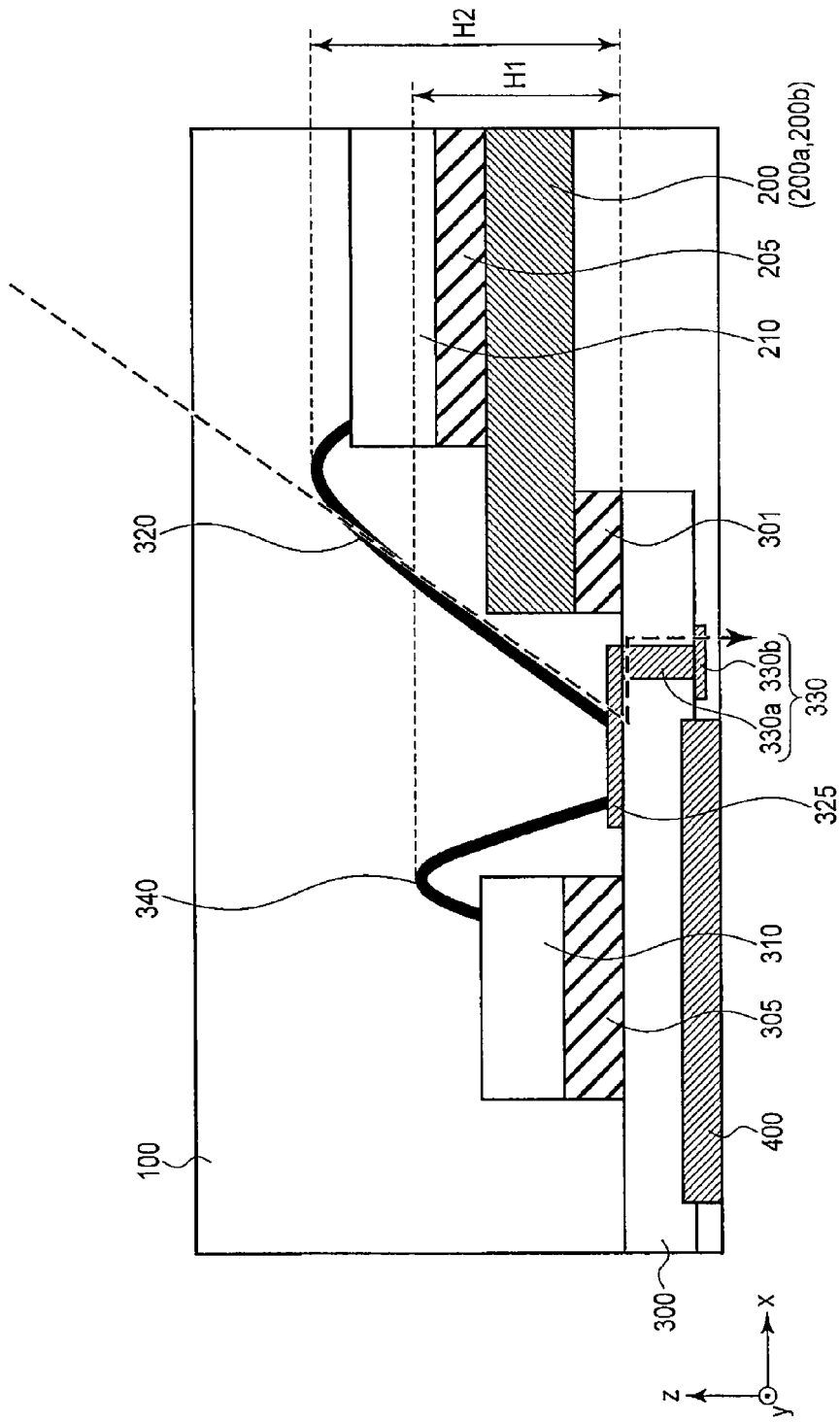
F I G. 12

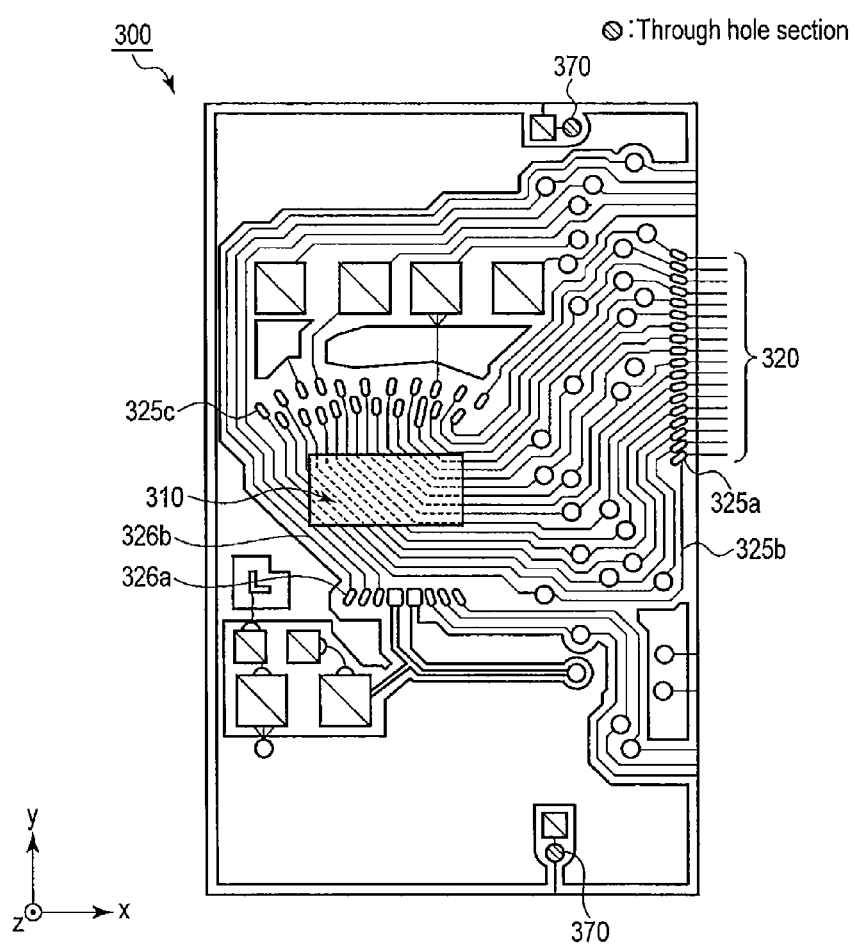
F I G. 14

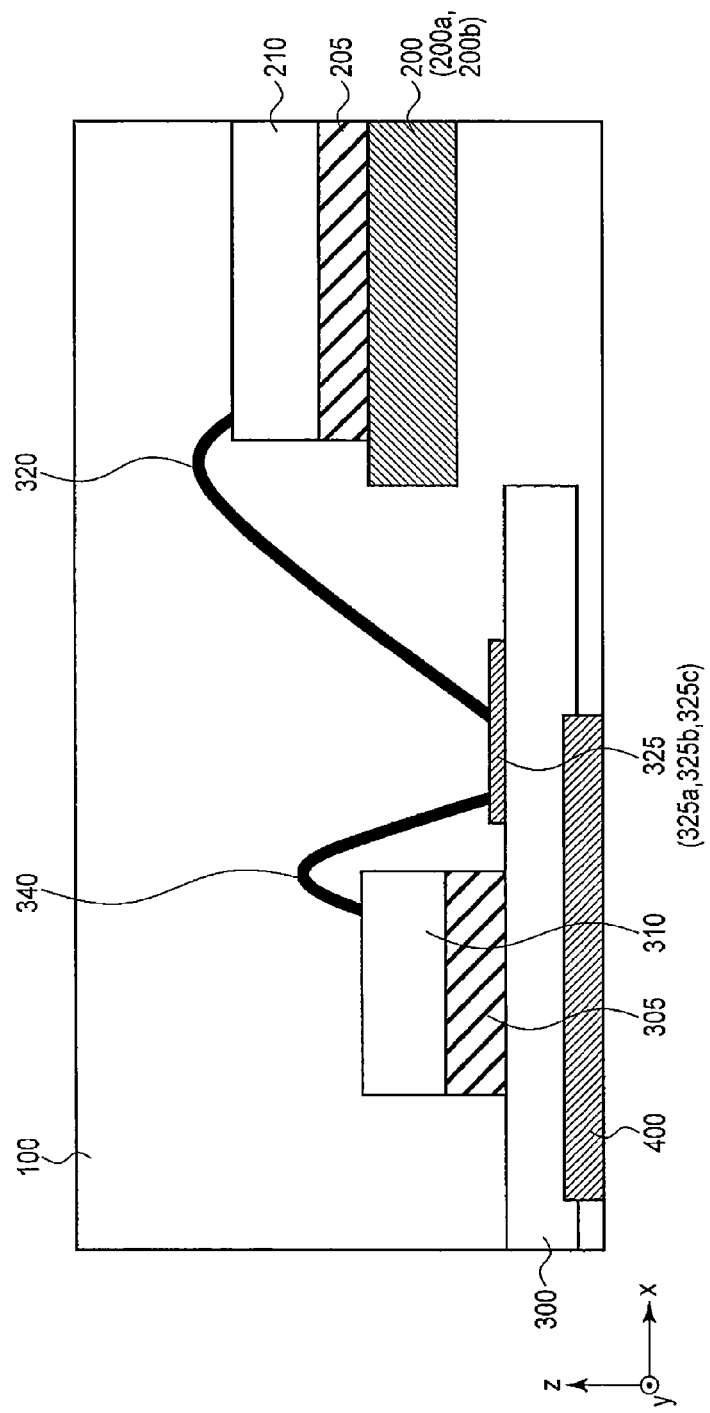
F I G. 15

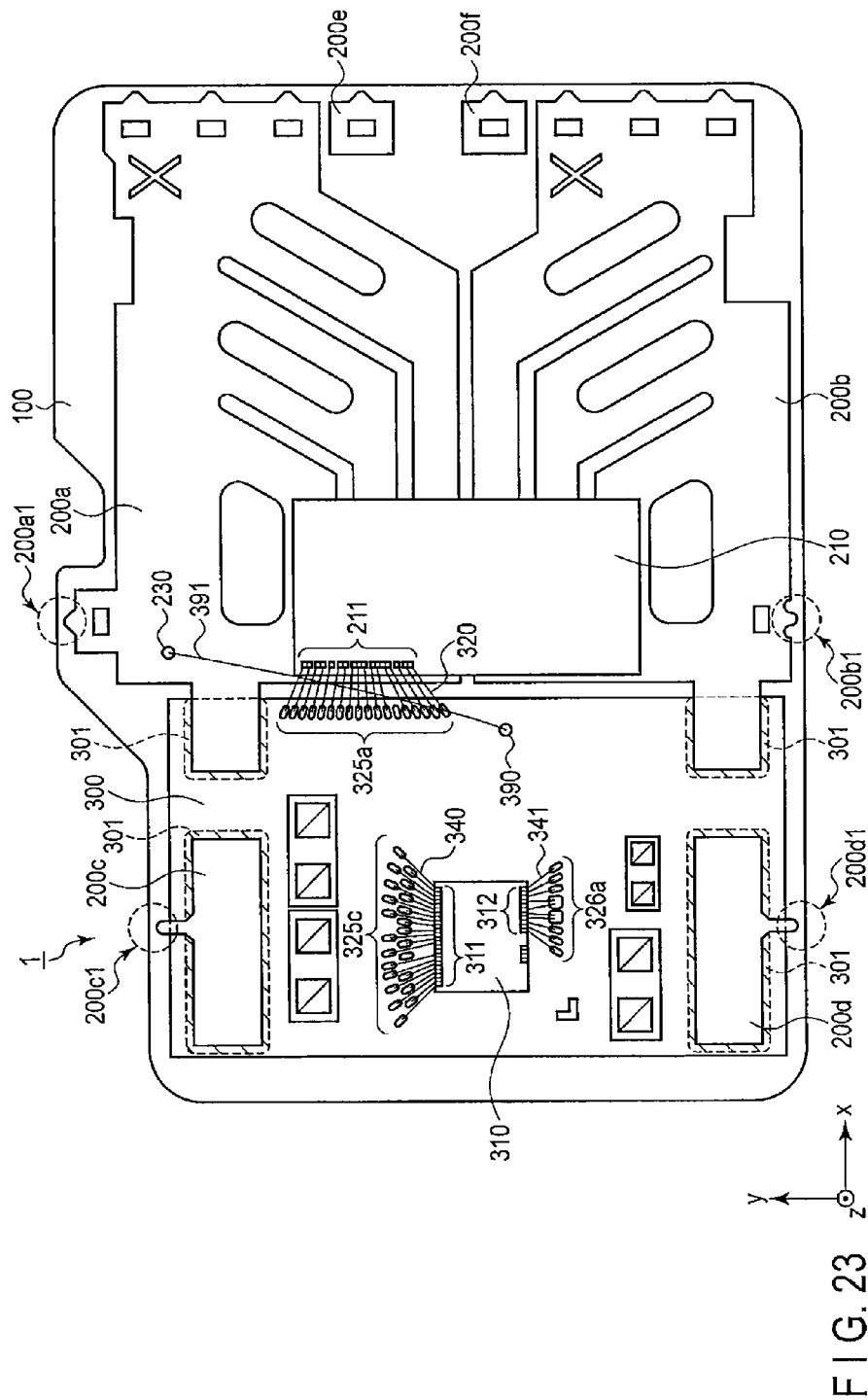
F I G. 23

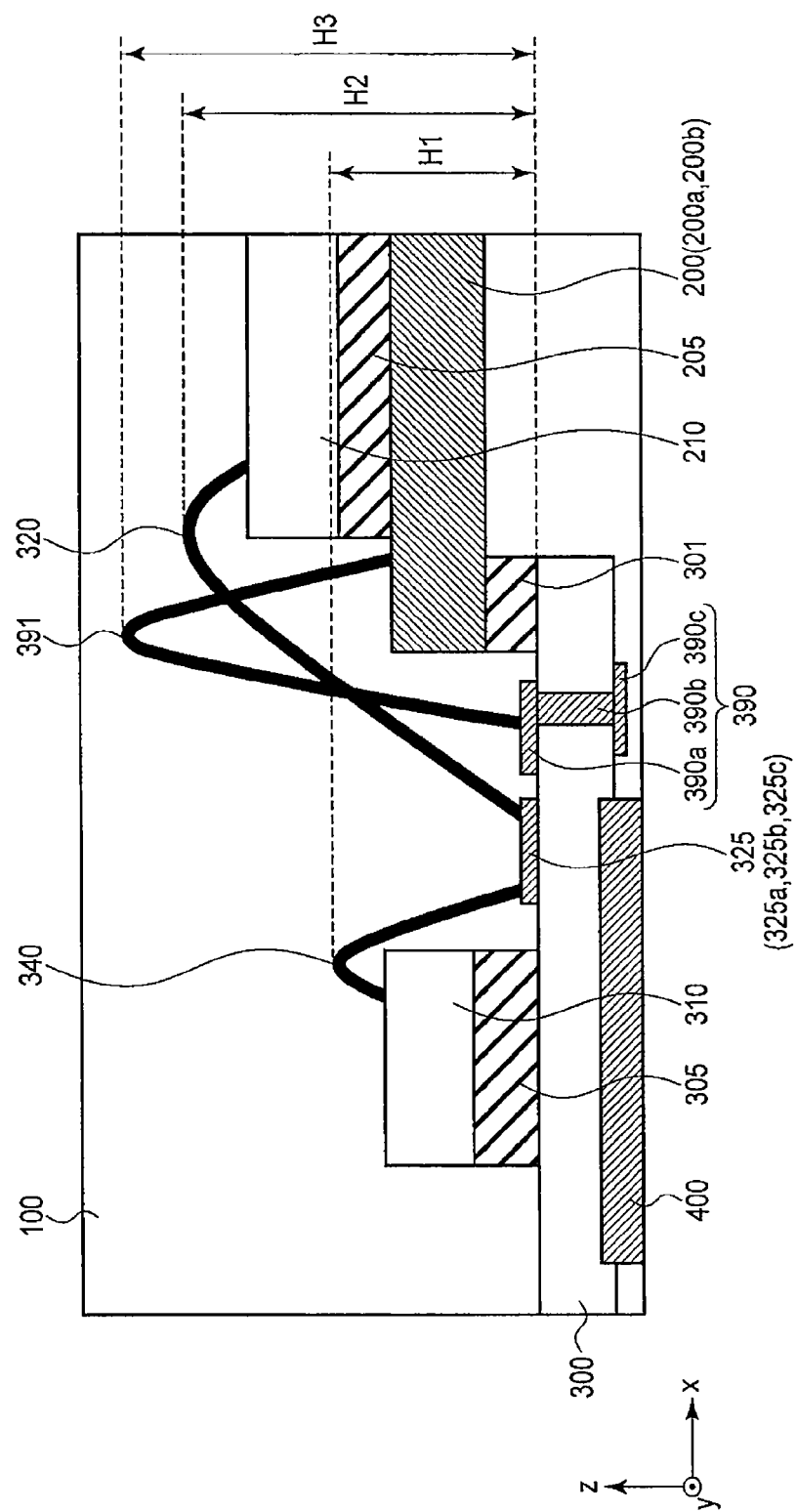
F I G. 24

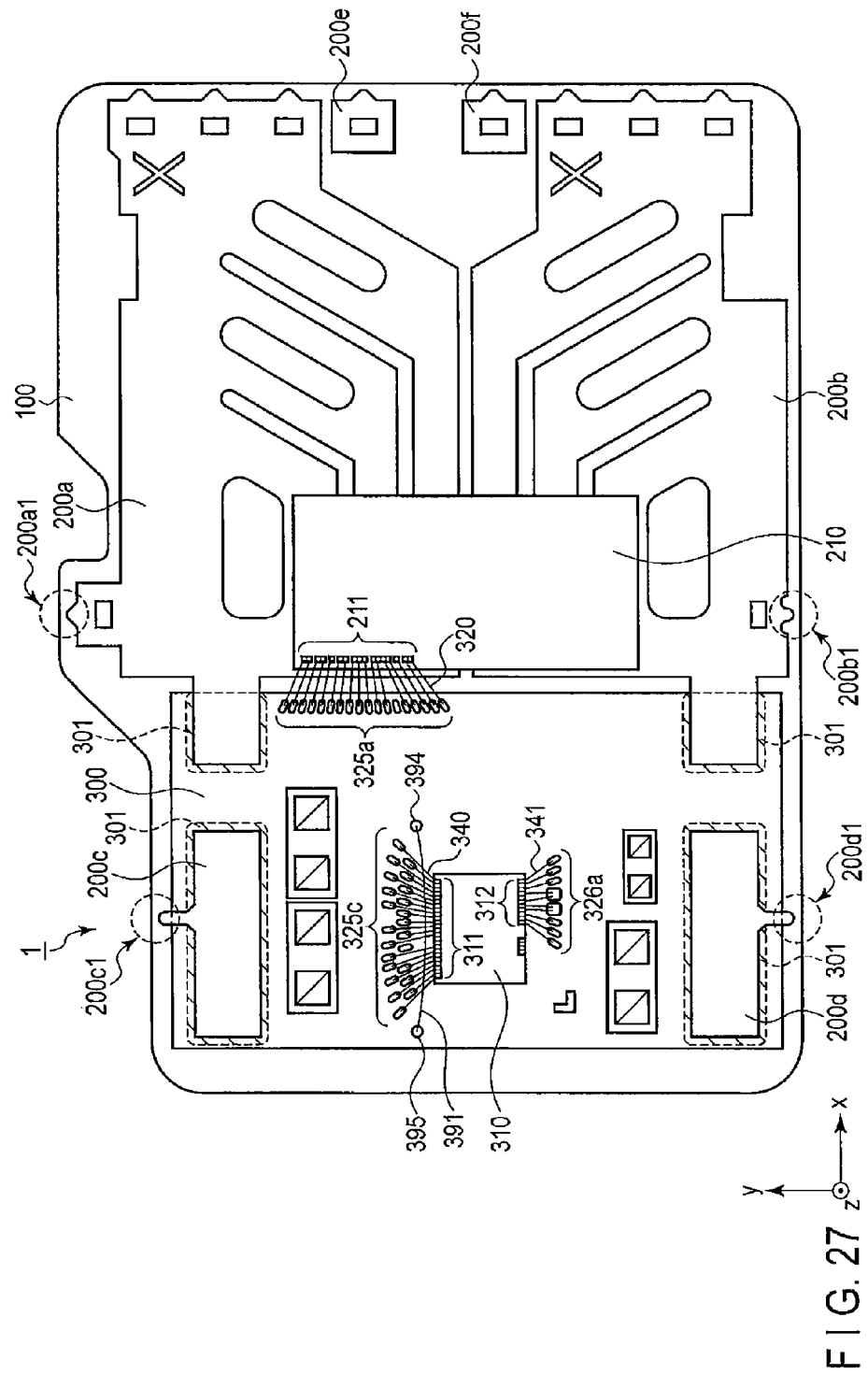
F I G. 27

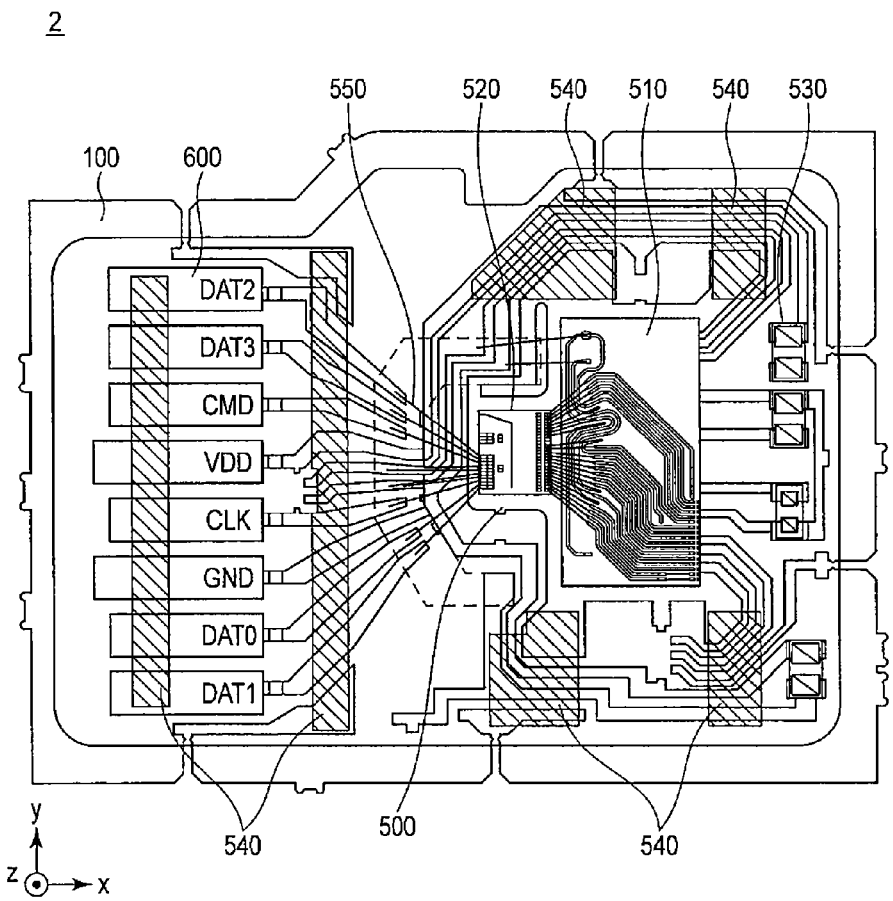
F I G. 28

SEMICONDUCTOR STORAGE DEVICE

CROSS-REFERENCE TO RELATED APPLICATIONS

This application is based upon and claims the benefit of priority from Japanese Patent Application No. 2011-159291, filed Jul. 20, 2011, the entire contents of which are incorporated herein by reference.

FIELD

Embodiments described herein relate generally to a semiconductor storage device.

BACKGROUND

As a memory card, an SD (registered trademark) card (hereinbelow referred to as SD card) is known. Further, a MICRO SD (registered trademark) card (hereinbelow referred to as MICRO SD card) is present. The MICRO SD card is similar to the SD card regarding its operation and property, whereas on the other hand, has a smaller size than the SD card. Similar to the SD card, the MICRO SD card has various restrictions which a product must obey depending on its specification set thereto. Further, likewise for any type of products, it is preferable for the MICRO SD card to also ensure product reliability, and enable efficient designing and manufacture.

BRIEF DESCRIPTION OF THE DRAWINGS

FIG. 1 schematically shows a specific example of an external appearance of a memory card of a first embodiment;

FIG. 2 is a diagram showing laser marks printed on the memory card of the first embodiment;

FIG. 3 is a cross sectional diagram schematically showing a basic inner structure of the example of the memory card of the first embodiment;

FIG. 4 is a flow chart schematically showing a basic manufacturing method of the memory card of the first embodiment;

FIG. 10 is a diagram schematically showing a basic interconnect structure of a substrate of the memory card of the third embodiment;

FIG. 12 is a cross sectional diagram schematically showing the basic structure of the memory card of the third embodiment;

FIG. 14 is a diagram schematically showing a basic interconnect structure of a substrate of the memory card of the fourth embodiment;

FIG. 15 is a cross sectional diagram schematically showing a basic structure of the memory card of the fourth embodiment;

FIG. 23 is a diagram schematically showing a basic inner structure of a memory card of a fifth embodiment;

FIG. 24 is a cross sectional diagram schematically showing a basic structure of the memory card of the fifth embodiment;

FIG. 27 is a diagram schematically showing a basic structure of a memory card of a second variant of the fifth embodiment;

FIG. 28 is a planar diagram schematically showing a basic inner structure of the memory card of the fifth embodiment.

DETAILED DESCRIPTION

Figure 5:
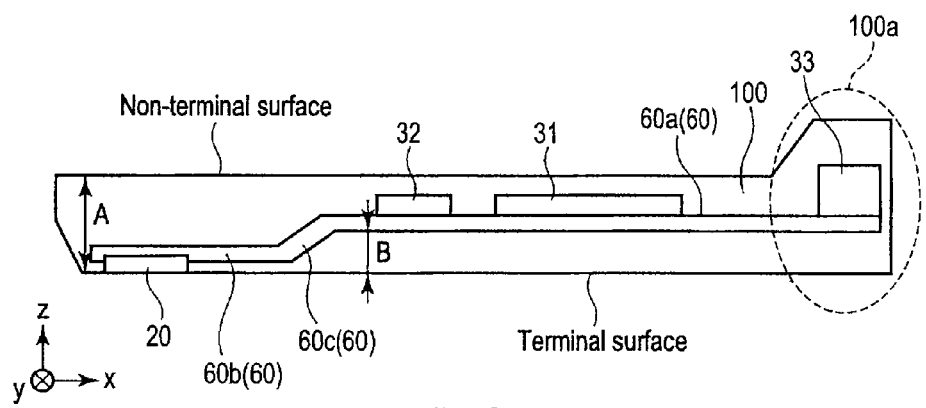
FIG. 5 is a cross sectional diagram schematically showing a basic inner structure of an example of a memory card of a first variant of the first embodiment.

In general, according to one embodiment, a semiconductor storage device is provided with a memory chip including a storage circuit, a controller chip that controls a memory chip, and a substrate having a first surface and a second surface opposing one another, on the first surface of which the controller chip is mounted. Further, the semiconductor storage device is provided with an external connection terminal formed on the second surface of the substrate, and resin that encapsulates the memory chip, the controller chip, and the substrate, includes a third surface and a fourth surface opposing one another, and has a predetermined mark directly printed only on the fourth surface that is adjacent to the second surface of the substrate.

Hereinbelow, details of the embodiments will be explained with reference to the drawings. In providing the explanations, portions common to all of the drawings will be given common reference signs. Alphabets after numbers configuring the reference signs may be referenced by reference signs including the same numbers, and are used to distinguish among elements having similar configurations. In cases where elements indicated by the reference signs including the same number do not need to be distinguished from one another, these elements will be referenced by a reference sign including only the number. For example, in a case where elements given reference signs 1a, 1b do not need to be distinguished from one another, these elements will collectively be referenced by a reference sign 1.

The drawings are schematic, and it should be noted that a relationship of thickness and planar dimensions, ratio of thickness of respective layers and the like differ from an actual configuration. Thus, specific thickness and dimensions should be determined by taking below explanations into consideration. Further, it goes without saying that portions having different dimensional relationships and ratios from one another are included among the drawings.

In embodiments hereinbelow, a memory card will be explained by taking a micro MICRO SD card as an example. However, the memory card in the following descriptions is not limited to the MICRO SD card. The descriptions of the present specification are applied to any memory card to which restrictions and problems imposed on the MICRO SD card and a below-described problem are imposed.

Aside from primarily having different sizes, the MICRO SD card has the same features as an SD card. For example, these two types of cards both include a memory chip and a controller chip that controls this memory chip. On the other hand, since the SD card has larger size than the MICRO SD card, restrictions imposed on the SD card in terms of design is lighter than the restrictions imposed on the MICRO SD card. That is, the MICRO SD card is more difficult to design than the SD card. Embodiments developed under such a background circumstance will be explained below.

First Embodiment

In the first embodiment, a memory card having a terminal surface, onto which an external connection terminal is provided and a logo mark, a mark of origin and an identification code are printed by laser marking will be explained.

<Structure of External Appearance of Memory Card>

Firstly, the structure of the external appearance of the memory card of the first embodiment will be explained with reference to FIG. 1 and FIG. 2. FIG. 1 is a diagram schematically showing a specific example of an external appearance of a memory card 10 of the first embodiment. FIG. 2 is a diagram showing a laser mark printed on the memory card 10 of the first embodiment.

As shown in FIG. 1, the memory card 10 includes mold resin (resin) 100. The resin 100 encapsulates respective chips, a circuit board, a lead frame and the like to be described later. The circuit board includes an upper surface and a lower surface (terminal surface) opposing one another, and a plurality of external connection terminals 20 (eight pieces of which are exemplified) is arranged on the terminal surface along one edge parallel to a y axis direction of the memory card 10. The external connection terminals 20 are not covered by the mold resin 100, and electrically connect a host device (external device) and the memory card 10 when the memory card 10 is inserted into the host device.

Further, as shown in FIG. 1 and FIG. 2, an SD logo (laser mark) 21a, a mark of origin (laser mark) 21b, and an identification code (laser mark) 21c are printed by laser on the terminal surface onto which the external connection terminals 20 are formed.

<Inner Structure of Memory Card>

A basic inner structure of an example of the memory card of the first embodiment will schematically be explained with reference to FIG. 3. FIG. 3 is a cross sectional diagram schematically showing the basic inner structure of the example of the memory card of the first embodiment.

As shown in FIG. 3, the memory card 10 includes the mold resin (resin) 100, a lead frame 30, a memory chip 31, a circuit board 40, a controller chip 32, and a passive component 33.

The resin 100 is formed of an insulating material, and encapsulates the lead frame 30 and the circuit board 40 so as to cover the same.

The lead frame 30 is for example a metal plate. The memory chip 31 is disposed on the lead frame 30 via an adhering layer (not shown). The lead frame 30 is adhered to the circuit board 40 via an adhering layer 50.

A controller chip 32 is disposed on an upper surface (a surface onto which the adhering layer 50 is adhered) of the circuit board 40 via an adhering layer (not shown). Further, the passive component 33 is disposed on the upper surface of the circuit board 40. Further, the external connection terminals 20 are arranged on a lower surface (a surface opposing the surface onto which the adhering layer 50 is adhered) of the circuit board 40. More specifically, the external connection terminals 20 are formed of a conductive material, and are arranged in the vicinity of an end portion (an end portion along the y axis in the drawings) of the memory card to be inserted into a PC. Further, the external connection terminals 20 are connected to the controller chip 32 and the like via conductive interconnects printed on the circuit board 40.

Any desired memory chip can be used as the memory chip 31; more specifically, for example, any type of NAND flash memory chip can be used. Further, a plurality of connection pads (not shown) that is electrically connected with a circuit inside the memory chip 31 is provided on an upper surface of the memory chip 31, and the connection pads are connected to connection pads (conductive sections) (not shown) on the circuit board 40 via conductive bonding wires (which may simply be referred to as wires) (not shown).

The controller chip 32 is for controlling operations of the memory chip 31. Specifically, it performs writing data to the memory chip 31, reading data from the memory chip 31, erasing data of the memory chip 31 and the like in accordance with commands from outside, and manages storage states of data in the memory chip 31. Further, the controller chip 32 may include a host interface, an MPU (micro processing unit), a ROM (read only memory), a RAM (random access memory), a memory interface and the like. Further, a plurality of connection pads (not shown) that is electrically connected with a circuit inside the controller chip 32 is provided on an upper surface of the controller chip 32, and the connection pads are connected to connection pads (conductive sections) (not shown) on the circuit board 40 via the wires (not shown).

Further, the passive component 33 refers to that among electric circuit components that does not provide power gain, and is for example a resistance, a capacitor, an inductor, and the like. Further, a plurality of connection pads (not shown) that is electrically connected with the circuit inside the controller chip 32 is provided on an upper surface of the passive component 33, and the connection pads are connected to the connection pads (conductive sections) (not shown) on the circuit board 40 via the wires (not shown).

<Manufacturing Method of Memory Card>

Next, a manufacturing method 1000 of the memory card 10 of the first embodiment will be explained with reference to FIG. 4. FIG. 4 is a flow chart schematically showing a basic manufacturing method of the memory card 10 of the first embodiment.

[S1001] Assembly

For example, in a case where the memory card 10 includes the substrate 40 and the lead frame 30, the lead frame 30 is connected to the substrate 40, and the controller chip 32, the memory chip 31, and the passive component 33 are mounted on these substrate 40 and lead frame 30. Thereafter, the lead frame 30 is disposed in a die, and by pouring the resin 100 therein, the substrate 40, the lead frame 30, the controller chip 32, the memory chip 31, the passive component 33 and the like are encapsulated.

[S1002] Marking

The "SD logo", the "mark of origin", and the "identification code" are printed (marked) by laser on the terminal surface. For example, by irradiating laser on the terminal surface of the resin 100, the surface of the resin 100 exposed to the laser is shaved (surface exfoliation), and the laser marks (the SD logo, the mark of origin, and the identification code) are formed.

[S1003] Testing

Subsequently, a testing process that is performed just before shipment of the memory card 10 is carried out. At this occasion, a confirmation on whether the memory card 10 operates correctly or not is performed. Since there is a possibility that the laser marking on the resin 100 has affected the memory chip 31, this testing process is preferably performed after the laser marking.

<Working and Advantageous Effects of Memory Card of First Embodiment>

According to the semiconductor storage device of the above described first embodiment, it includes the memory chip 31 including the storage circuit, a controller chip 32 that controls the memory chip 31, and the substrate 30, 40, 60 having the first surface and the second surface opposing one another, on the first surface of which the controller chip 32 is mounted. The semiconductor storage device includes the external connection terminals 20 formed on the second surface of the substrate 30, 40, 60, and the resin 100 that encapsulates the memory chip 31, the controller chip 32, and the substrate 30, 40, 60, and has the third surface and the fourth surface opposing one another, on only the fourth surface of which that is adjacent to the second surface of the substrate 30, 40, 60, the predetermined marks 21 are directly printed.

Moreover, basically in an SD card, there is a rule that the printing must be performed on an SD card main body (resin) so that a user can visually recognize at least the SD logo. Due to this, the SD logo and the like must be printed on at least one of the terminal surface and the non-terminal surface of the SD card.

Further, when the laser is irradiated on the surface of the resin 100 in the vicinity of the memory chip 31 (non-terminal surface), the memory chip 31 may be damaged due to the laser.

However, in the present embodiment, the laser is irradiated to the surface (terminal surface) of the resin 100 in the vicinity of the lead frame 30. Due to this, the memory chip 31 is protected by the lead frame 30. As a result, compared to the case of irradiating the laser on the non-terminal surface that is not protected by the lead frame 30, the damage to the memory chip 31 can be suppressed.

Further, as described above, according to the present embodiment, the SD logo, the mark of origin, and the identification code are printed only on the terminal surface of the resin 100, and the SD logo, the mark of origin, and the identification code are not printed only on the non-terminal surface. Due to this, printings of illustration and the like can freely be performed on the non-terminal surface. The non-terminal surface has an advantage of having a wider area onto which the printing can be performed than the terminal surface due to not having the external connection terminals provided thereon. Further, in the present embodiment, since the respective printing processes are not performed using ink, so processes related to printing can be omitted compared to a case of performing an ink marking process.

(First Variant of First Embodiment)

Next, a memory card of a first variant of the first embodiment will be explained. In the above described first embodiment, a memory card 10 including a circuit board 40, and a lead frame 30 adhered to the circuit board 40 via an adhering layer 50, and having a memory chip 31, a controller chip 32, and a passive component 33 on the circuit board 40 and the lead frame 30 was explained. However, in the first variant of the first embodiment, a memory card 10 provided with a lead frame 60, a memory chip 31, a controller chip 32, and a passive component 33 will be explained. Note that a basic configuration and a basic operation are similar to the above described first embodiment. Thus, explanations on matters explained in the first embodiment and matters that can easily be assumed from the above described first embodiment will be omitted.

<Inner Structure of Memory Card>

A basic inner structure of an example of the memory card of the first variant of the first embodiment will schematically be explained with reference to FIG. 5. FIG. 5 is a cross sectional diagram schematically showing the basic inner structure of the example of the memory card of the first variant of the first embodiment. As shown in FIG. 5, the memory card 10 includes mold resin (resin) 100, the lead frame 60, the memory chip 31, the controller chip 32, and the passive component 33.

The resin 100 encapsulates the lead frame 60, the memory chip 31, the controller chip 32, and the passive component 33.

The lead frame 60 is for example a metal plate. Further, the lead frame 60 includes a region 60a where the memory chip 31, the controller chip 32, and the passive component 33 are disposed on a front surface thereof, a region 60b where a plurality of external connection terminals 20 is disposed on a back surface thereof, and a region 60c that electrically connects the region 60a and the region 60b.

The region 60a is positioned for example in the vicinity of a middle portion between a non-terminal surface and a terminal surface so that static electricity from outside is unlikely to enter into respective devices disposed on the region 60a for example, and the region 60b is disposed closer to the terminal surface of the resin 100 so that the external connection terminals 20 are exposed from the resin 100.

The memory chip 31, the controller chip 32, and the passive component 33 are disposed on the surface of the region 60a.

The external connection terminals 20 are formed of a conductive material. Further, the external connection terminals 20 are connected to the controller chip 32 and the like via the lead frame 60 and the like.

Here, an example of thicknesses (lengths along a z axis direction) of respective sections of the memory card 10 will be shown. The thickness of the resin 100 (refer to A in the drawing) is about 0.68 mm. Further, the thickness of the resin from the terminal surface of the resin 100 to the region 60a of the lead frame 60 (refer to B in the drawing) is about 0.25 mm. Further, the thickness of the lead frame 60 is about 0.13 mm. Further, the film thickness of the memory chip 31 and the controller chip 32 is about 0.1 mm. Moreover, the thickness of an adhering layer (not shown) that adheres the memory chip 31 and the lead frame is about 0.02 mm. Similarly, the film thickness of an adhering layer (not shown) that adheres the controller chip 32 and the lead frame is also about 0.02 mm.

A plurality of connection pads (not shown) that is electrically connected to a circuit in the memory chip 31 is provided on an upper surface of the memory chip 31, and is connected to the lead frame 60 via conductive bonding wires (not shown).

A plurality of connection pads (not shown) that is electrically connected to a circuit in the controller chip 32 is provided on an upper surface of the controller chip 32, and is connected to the lead frame 60 via wires (not shown). Further, a plurality of connection pads (not shown) that is electrically connected to the circuit in the controller chip 32 is provided on an upper surface of the passive component 33, and is connected to the lead frame 60 via wires (not shown).

The passive component 33 is thick (has a longer length in the z axis direction) compared to the memory chip 31 and the controller chip. Due to this, it is formed in a protruding region 100a of the non-terminal surface of the resin 100 with the largest thickness from the upper surface of the lead frame 60a to the surface of the resin 100.

(Second Variant of the First Embodiment)

Next, a memory card of the second variant of the first embodiment will be explained. In the first embodiment, explanations were given regarding printing labels such as an SD logo, a mark of origin, an identification code and the like on resin using laser. The second variant of the first embodiment will explain a method of printing on the resin in a case of combining laser printing with ink printing. Note that a basic configuration and a basic operation are similar to the above described first embodiment. Thus, explanations on matters explained in the first embodiment and matters that can easily be assumed from the above described first embodiment will be omitted.

<Structure of External Appearance of Memory Card>

Figure 6:
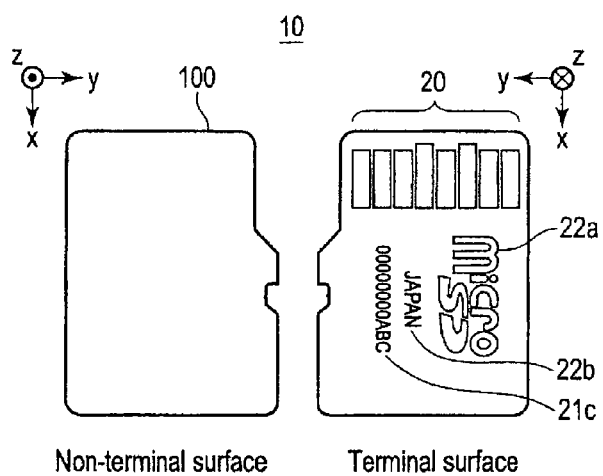
FIG. 6 is a diagram schematically showing a specific example of the external appearance of the memory card.

FIG. 6 is a diagram schematically showing a specific example of an external appearance of a memory card 10. As shown in FIG. 6, an SD logo 22a, a mark of origin 22b, and an identification code 21c are printed on a terminal surface of the memory card 10. The SD logo 22a and the mark of origin 22b are ink marks printed by using ink, and the identification code 21c is a laser mark printed by using laser.

<Method of Manufacturing Memory Card>

Figure 7:
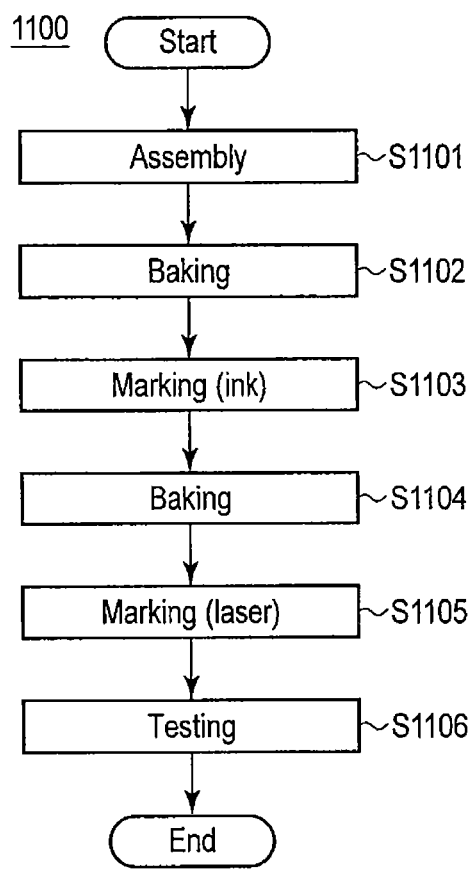
FIG. 7 is a flow chart schematically showing a basic manufacturing method of a memory card of a second variant of the first embodiment.

Next, a manufacturing method 1100 of the memory card 10 of the second variant of the first embodiment will be explained with reference to FIG. 7. FIG. 7 is a flow chart schematically showing a basic manufacturing method 1100 of the memory card 10 of the second variant of the first embodiment.

[S1101] Assembly

For example, in a case where the memory card 10 includes a substrate and a lead frame, the lead frame is connected to the substrate, and a controller chip, a memory chip, and a passive component are mounted on this substrate and the lead frame. Thereafter, the lead frame is disposed in a die, resin is poured therein, and the substrate, the lead frame, the controller chip, the memory chip, the passive component and the like are encapsulated.

[S1102] Baking

Subsequently, before printing by using ink, baking is performed to dry moisture in the resin.

[S1103] Marking (Ink)

Then, for example the "SD logo" and the "mark of origin" are printed by ink on a terminal surface.

[S1104] Baking

Thereafter, moisture of the ink marks (the "SD logo" and the "mark of origin") is dried by baking, and the ink marks are fixed to the terminal surface.

[S1105] Marking (Laser)

Then, the "identification code" is printed on the terminal surface by laser.

[S1106] Testing

Subsequently, a testing process that is performed just before shipment of the memory card 10 is carried out. At this occasion, a confirmation on whether the memory card 10 operates correctly or not is performed. Since there is a possibility that the laser marking on the resin 100 has affected the memory chip, this testing process is preferably performed after the laser marking.

Second Embodiment

<Structure of External Appearance of Memory Card>

Figure 8:
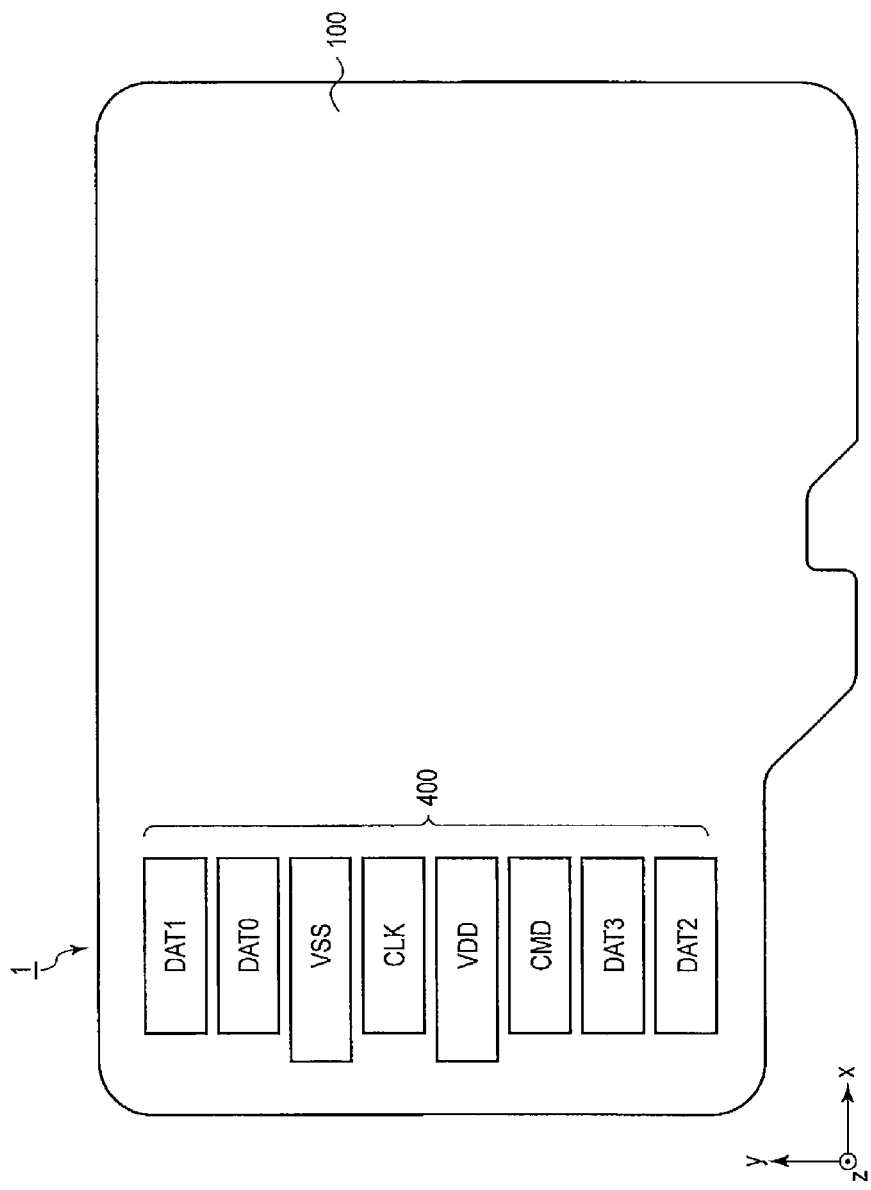
FIG. 8 is a diagram schematically showing a basic external appearance of a memory card of an embodiment.

FIG. 8 is a diagram schematically showing a specific example of an external appearance of a memory card 1. As shown in FIG. 8, the memory card 1 includes mold resin (resin) 100. The resin 100 encapsulates respective chips, a circuit board, and a lead frame to be described later. The circuit board includes an upper surface and a lower surface (terminal surface) opposing one another, and a plurality of external connection terminals 400 (eight pieces of which are exemplified) is arranged on the terminal surface along an upper edge of the memory card 1. The external connection terminals 400 are formed of a conductive material, are formed on the circuit board, and are connected to conductive interconnects (which may be referred to a pattern) printed on the circuit board. Further, the external connection terminals 400 are not covered by the mold resin 100, and electrically connect a host device and the memory card 1 when the memory card 1 is inserted into the host device. In an example complying with a standard of signal allocation to the external connection terminals 400, data 2 (DAT2), data 3 (DAT3), command (CMD), VDD, clock (CLK), VSS, data 0 (DAT0), and data 1 (DAT1) are allocated to the external connection terminals 400, respectively. Note that, in the present embodiment, explanations of the respective signals will be omitted.

<Inner Structure of Memory Card>

Figure 9:
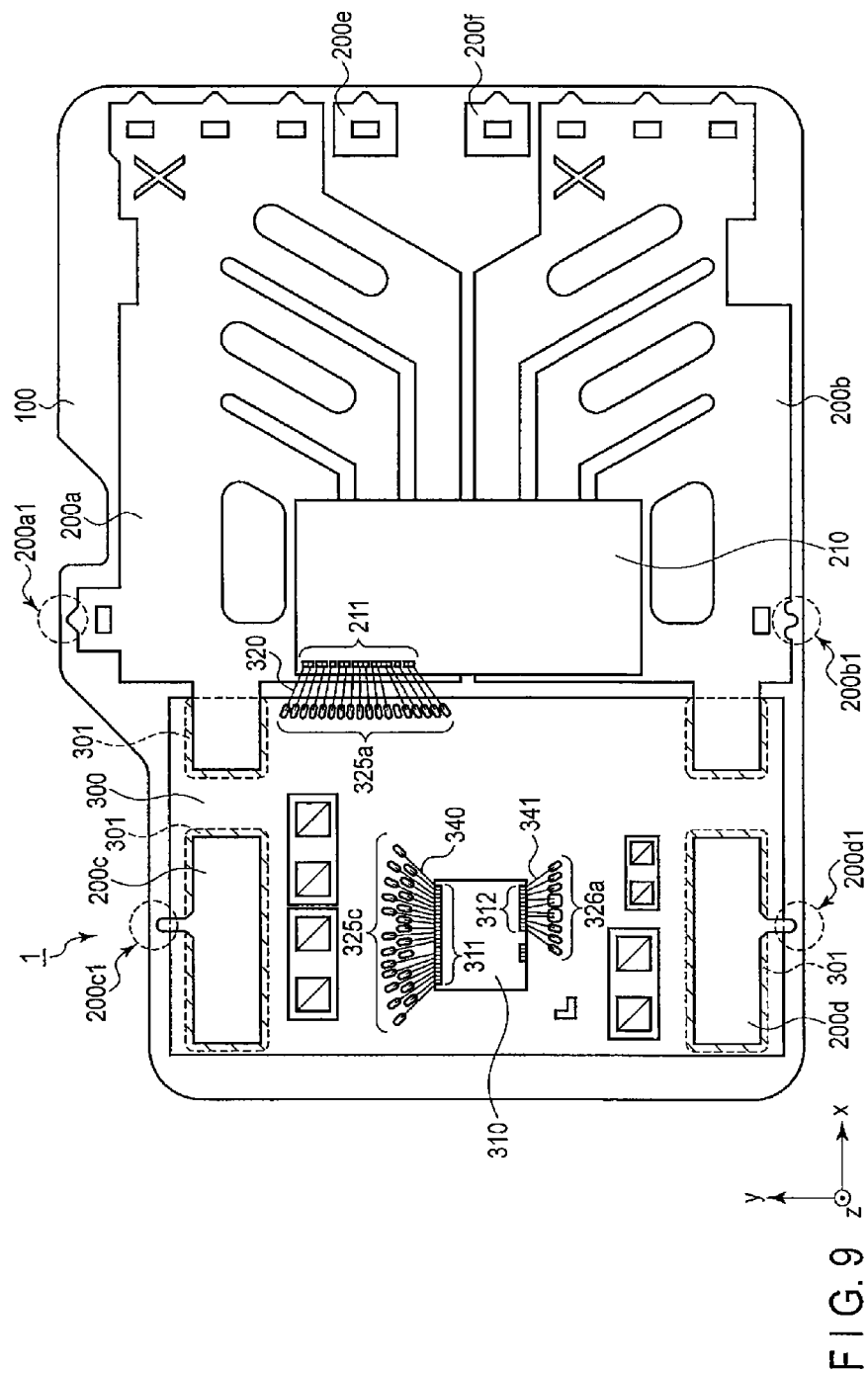
FIG. 9 is a diagram schematically showing a basic inner structure of a memory card of a third embodiment.

A basic inner structure of the memory card of the present embodiment will schematically be explained with reference to FIG. 9. FIG. 9 is a diagram schematically showing the basic inner structure of the memory card of the present embodiment. As shown in FIG. 9, the memory card 1 includes the mold resin (resin) 100, a lead frame 200, a memory chip 210, a circuit board 300, and a controller chip 310.

The resin 100 is formed of an insulating material, and encapsulates the lead frame 200 and the circuit board 300 so as to cover the same.

The lead frame 200 is for example a metal plate, and is for example divided into six pieces, namely, lead frames 200a, 200b, 200c, 200d, 200e, and 200f. The lead frames 200a to 200f are electrically separated from one another by the resin 100 that is an insulator. Although the lead frame 200 of the present embodiment is divided into six pieces, no limitation is made hereof, and an increase or a decrease in the number may be made. Note that, although 200a, 200b, 200c, 200d, 200e, and 200f are leads (conductive plates) that are electrically separated individually, in a manufacturing process, they are described as a lead frame for the sake of convenience, since they are divided from the lead frame 200 that is originally an integral component.

A memory chip 210 is disposed on the lead frames 200a and 200b via an adhering layer (not shown). The lead frames 200c and 200d are adhered to the circuit board 300 via an adhering layer 301. Further, although no detailed explanation for the lead frames 200c, 200d, 200e, and 200f will not be given hereof, they may for example be dummy lead frames used in forming the memory card 1.

Further, protrusion (portions) 200a1, 200b1, 200c1, and 200d1 (see insides of broken lined circles) that protrude outward from the memory card 1 are formed on contour edges of the lead frames 200a, 200b, 200c, 200d along a direction (direction parallel to an x axis) of insertion of the memory card 1 to a host device (not shown). Each of these portions 200a1, 200b1, 200c1, and 200d1 is narrowed toward a tip as it extends outward (in a direction parallel to a y axis that is vertical to the x axis direction) from the memory card 1. Due to this, even in cases where a surge or ESD (electro static discharge) is applied from outside of the memory card 1, a surge current generated thereafter can be reduced. Further, these tip portions are positioned on an inner side than an outer surface of the memory card. Due to this, even when a conductor makes contact with the outer surface of the memory card, no electrical conduction will be generated in 200a and the like. Note that, spaces between these 200a, 200b, 200c, 200d, 200e, 200f and the outer surface of the memory card may be filled by resin, or may be hollow gaps. Further, since the lead frames 200a, 200b, 200c, 200d are electrically separated from one another, even in cases for example where the portions 200a1 and 200c1 make contact with conductive sections of the host device, the memory card 1 will not be short-circuited. Similarly, in cases for example where the portions 200b1 and 200d1 make contact with the conductive sections of the host device, the memory card 1 will not be short-circuited.

A controller chip 310 is disposed on an upper surface of the circuit board 300. Further, a plurality of external connection terminals 400 (not shown) is arranged on a lower surface of the circuit board 300. The external connection terminals 400 are formed of a conductive material, and are formed on the lower surface of the circuit board 300. Further, the external connection terminals 400 are connected to the controller chip 310 via conductive interconnects printed on the circuit board 300.

Further, a part of the circuit board 300 is connected to the lead frames 200a to 200d via the adhering layer 301. Further, as will be described later, interconnects (not shown) are printed on the circuit board 300 by using a conductive material. Note that, according to the present embodiment, although a part of the lead frame 200 is connected to the circuit board 300, no limitation is made hereof.

Any desired memory chip can be used as the memory chip 210; more specifically, for example, any type of NAND flash memory chip can be used. Further, a plurality of connection pads 211 that is electrically connected with a circuit inside the memory chip 210 is provided on an upper surface of the memory chip 210, and the connection pads 211 are connected to connection pads (conductive sections) 325a on the circuit board 300 via conductive bonding wires (which may simply be referred to as wires) 320.

The controller chip 310 is for controlling operations of the memory chip 210. Specifically, it performs writing data to the memory chip 210, reading data from the memory chip 210, erasing data of the memory chip 210 and the like in accordance with commands from outside, and manages storage states of data in the memory chip 210. Further, the controller chip 310 may include a host interface, an MPU (micro processing unit), a ROM (read only memory), a RAM (random access memory), a memory interface and the like. Further, a plurality of connection pads 311 that is electrically connected with a circuit inside the controller chip 310 is provided on an upper surface of the controller chip 310, and the connection pads 311 are connected to connection pads (conductive sections) 325c on the circuit board 300 via wires 340.

<Interconnect Structure of Circuit Board>

Next, a connection of the memory chip 210 and the controller chip 310 will be explained with reference to FIG. 10. This FIG. 10 shows the interconnects (patterns) on the circuit board 300, and the conductive interconnects are expressed by black portions.

The wires 320 are connected to the connection pads (conductive sections) 325a on the circuit board 300. The connection pads 325a are connected to conductive interconnects (conductive sections) 325b on the circuit board 300.

The wires 340 are connected to the connection pads (conductive sections) 325c on the circuit board 300. The connection pads 325c are connected to the conductive interconnects 325b on the circuit board 300.

Incidentally, as of a set of a connection pad 325a, a interconnect 325b, and a connection pad 325c (hereinbelow referred also as a conductive section 325), a plurality of sets thereof is provided so as to connect the connection pads 211 of the memory chip 210 and the connection pads 311 of the controller chip 310, respectively.

The circuit board 300 has through hole sections 330 in which a conductive metal material is embedded in through holes (opening sections) penetrating from the upper surface of the circuit board 300 to the lower surface thereof. Further, the through hole sections 330 are connected to the interconnects 325b between the connection pads 325a, 325c. Further, the through hole sections 330 are disposed so as to be electrically separated from the external connection terminals 400.

Further, a plurality of connection pads 312 is provided on the upper surface of the controller chip 310, and the connection pads 312 are connected to connection pads (conductive sections) 326a on the circuit board 300 via conductive bonding wires (which may simply be referred to as wires) 341. The connection pads 326a are connected to interconnects 326b on the circuit board 300. Further, the interconnects 326b are electrically connected to the external connection terminals 400.

Figure 11:
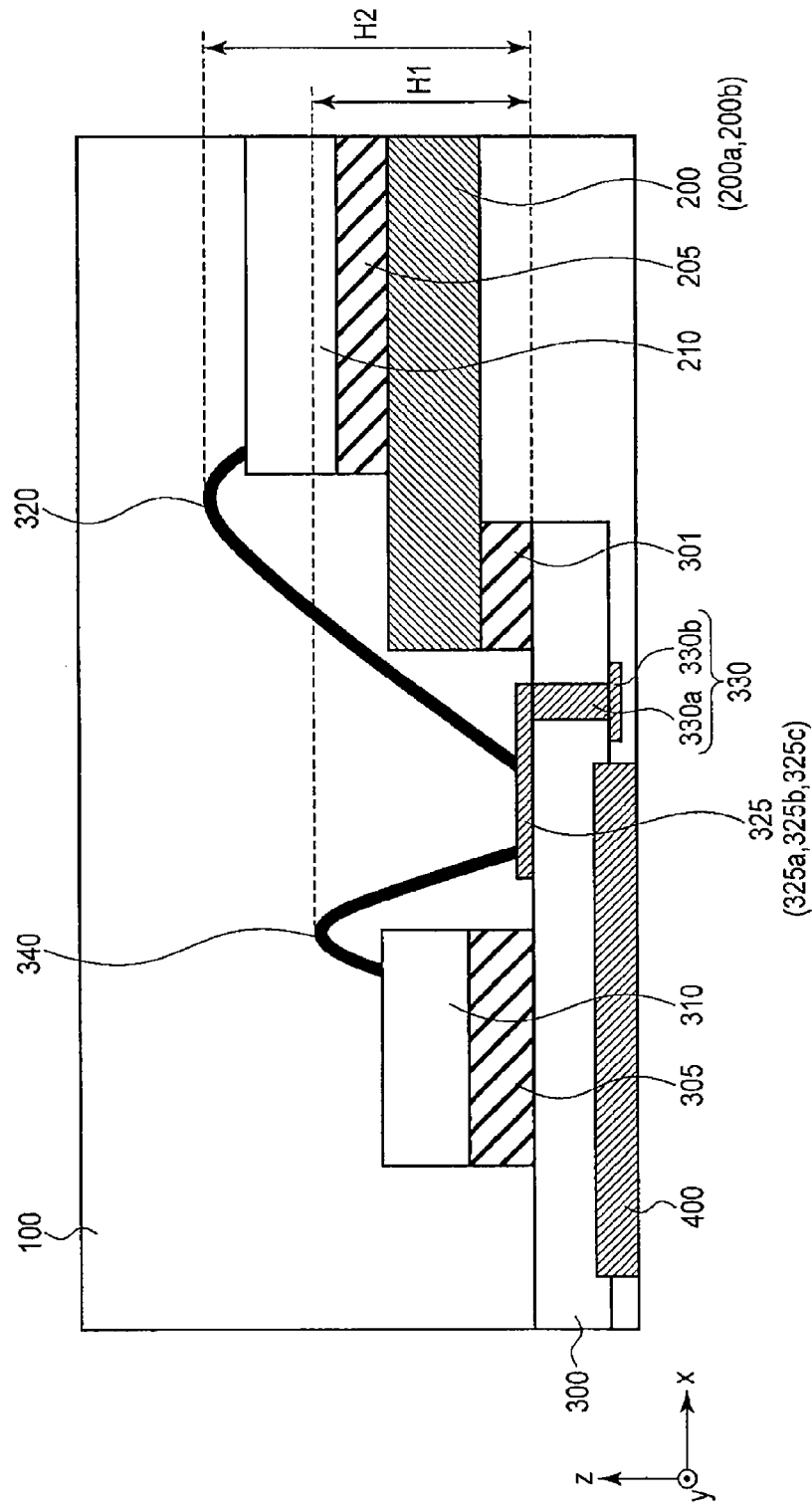
FIG. 11 is a cross sectional diagram schematically showing a basic structure of the memory card of the third embodiment.

Next, a cross section along the x direction of the memory card 1 of the present embodiment will be explained with reference to FIGS. 11 and 12. Note that, these FIGS. 11 and 12 show a connecting relationship of the memory chip 210, the controller chip 310 and the through hole section 330 with one conductive section 325 among the plurality of conductive sections 325 as provided. Due to this, the arrangement, size and the like of the respective portions are schematically depicted. FIG. 9 should be referred to for a more accurate positional relationship of the respective portions.

As shown in FIG. 11, the lead frames 200a, 200b (hereinbelow expressed as lead frame 200 for the sake of simplicity) having a film thickness of about 100 to 150 nm are provided on the upper surface of the circuit board 300 in the vicinity of an end portion of the circuit board 300 along the x axis direction, via the adhering layer 301 formed of an insulating tape material (for example, an adhering film for LOC (Lead On Chip) or a die bonding film; more specifically, formed of a thermoplastic adhering film (majority of which is formed of polyimide systems) having a film thickness for example of about few tens of nanometers. Further, the memory chip 210 having a film thickness for example of about 80 to 100 nm is provided on the on the lead frame 200, via the adhering layer 205 formed of an insulating material (DIE attach film) having a film thickness for example of about few tens of nanometers. Further, the controller chip 310 having a film thickness for example of about 100 to 150 nm is provided on the on the circuit board 300, via the adhering layer 305 formed of an insulating material (DIE attach film) having a film thickness for example of about few tens of nanometers.

The circuit board 300 has the connection pads 325a, 325c, and the interconnect 325b that are electrically connected to one another. Further, a through hole (opening section) penetrating the upper surface and the lower surface thereof is formed on the circuit board 300, a metal material is embedded in the through hole, and thereby an embedded section 330a is formed. Further, a lower layer section 330b formed of a metal material is formed on the lower surface of the circuit board 300 and under the embedded section 330a. The lower layer section 330b is electrically connected to the embedded section 330a, and has its periphery covered by resin 100. A set of this embedded section 330a and the lower layer section 330b will be termed a through hole section 330, and as shown in FIG. 10, if there is a plurality of through hole sections 330, each of the through hole sections 330 is electrically separated from one another so as not to cause short circuits in the respective through holes. Further, an upper surface of the embedded section 330a is connected to the interconnect 325b. Further, the connection pad 211 (not shown) of the memory chip 210 and the connection pad 325a of the circuit board 300 are electrically connected by the wire 320 formed of an Au material, and the connection pad 311 (not shown) of the controller chip 310 and the connection pad 325c of the circuit board 300 are electrically connected by the wire 340 formed of the Au material. Accordingly, the memory chip 210, the wire 320, the conductive section 325, the through hole section 330, the wire 340, and the controller chip 310 are electrically connected.

Further, the lead frame 200, the memory chip 210, the circuit board 300, the controller chip, the wires 320, 340, and the through hole sections 330 are covered by the resin 100 formed of the insulating material.

Further, the external connection terminals 400 are provided on the lower surface of the circuit board 300. Lower surfaces of these external connection terminals 400 are exposed from the resin 100.

Incidentally, a height H1 along a z axis direction that vertically intersects with an x axis and a y axis of the wire 340 connecting the controller chip 310 and the circuit board 300 is low compared to a height H2 along the z axis direction of the wire 320. This is due to a height along the z axis direction from the circuit board 300 to an upper surface of the memory chip 210 being higher than a height along the z axis direction from the circuit board 300 to an upper surface of the controller chip 310. In the present embodiment, among conductive components provided within the memory card 1, for example the height H2 along the z axis direction of the wires 320 is higher than heights of other components (for example, the height H1 of the wire 340). Note that, although not shown in FIG. 11, a height of a wire 341 connecting the external connection terminal 400 and the controller chip 310 is the same as the height H1 of the wire 340.

<Operation Upon Surge Intrusion>

Next, an operation in a case where a surge (a transitional abnormal high voltage, ESD) from outside intrudes into the memory card 1 will be explained with reference to FIG. 12. The surge from outside tends to intrude into a conductive material having a close distance from an outside of the resin 100. Due to this, for example, the surge intrudes from the wire 320 to the inside of the memory card 1. Since the surge flows toward a portion with a lower resistance, it flows into the through hole section 330 in which metal is embedded with priority (refer to a broken lined arrow in the drawing). Due to this, a drastic voltage application on the memory chip 210 and the controller chip 310 caused by the surge can be suppressed. Accordingly, since the height of the wire 341 is lower than the height of the wire 320, no through hole section needs to be provided at the conductive section 326 to which the wire 341 is connected.

<Working and Advantageous Effects of Second Embodiment>

In the recent years, a memory card for storing movies, images, music data and the like is being widely used. The memory card is commonly used for storing data for host devices such as cell phones, portable digital assistants, portable music players, digital cameras and the like. To further make the use in portable compact host devices more convenient, the memory card is required to be small. Further, improvements in data transfer speed between the memory card and the host device is also required. Further, needless to say, a certain reliability of the memory card is also required.

According to the above described embodiment, the memory card (semiconductor storage device) 1 is provided with the memory chip including the storage circuit 210 and the controller chip 310 that controls the memory chip 210. Further, the memory card 1 is provided with the circuit board 300 having the first surface and the second surface opposing one another, on the first surface of which the controller chip 310 is mounted, and the first interconnect 325 formed on the first surface of the circuit board 300. Further, the memory card 1 is provided with the first wire 320 having one end connected to the memory chip 210 and the other end connected to the first interconnect 325, and the second wire 340 having one end connected to the controller chip 310 and the other end connected to the first interconnect 325. Further, the memory card 1 is provided with the conductive through hole section 330 to which the first interconnect 325 is connected, and that penetrates the first surface and the second surface of the circuit board 300. Further, the memory card 1 is further provided with the metal plate 200 onto which the memory chip 210 is mounted, and having only a part of which being connected to the first surface of the circuit board 300 via the adhering layer 301.

By providing the through hole section in which the metal is embedded between the memory chip and the controller chip, the surge that has intruded into the wire can be discharged to the through hole section. Due to this, the surge that may damage the memory chip or the controller chip can be reduced, and resistivity of the memory card against the ESD (electrostatic discharge damage) can be improved.

Note that, according to the above described second embodiment, although the through hole sections 330 were provided to all of the conductive sections 325 connecting the memory chip 210 and the controller chip 310, however, such is not necessarily mandatory. Effects similar to the effects as explained above can be obtained by providing the through hole section 330 at only the desired conductive section 325.

Further, as shown in FIG. 9, in the conductive sections 325 to which the through hole sections 330 are already provided, additional through hole sections 350 may be provided thereto. In so doing, similar to the through hole sections 330, the through hole sections 350 may be disposed so as to be electrically separated from the external connection terminals 400. Further, in considering the surge that may enter into the wires 341 connected to the controller chip 310, through hole sections may be provided at the conductive sections 326. In this case, similar to the through hole sections 330, the aforementioned through hole sections are disposed so as to be electrically separated from the external connection terminals 400.

Third Embodiment

Next, the third embodiment will be explained. Note that, a basic configuration and a basic operation are similar to those of the above described second embodiment. Thus, explanations on matters explained in the above described second embodiment and matters that can easily be assumed from the above described second embodiment will be omitted. The third embodiment differs from the above described second embodiment in that wires that connect a lead frame and a circuit board are further provided, and the wires are connected to through hole sections explained above.

<Structure of Memory Card of Third Embodiment>

Figure 13:
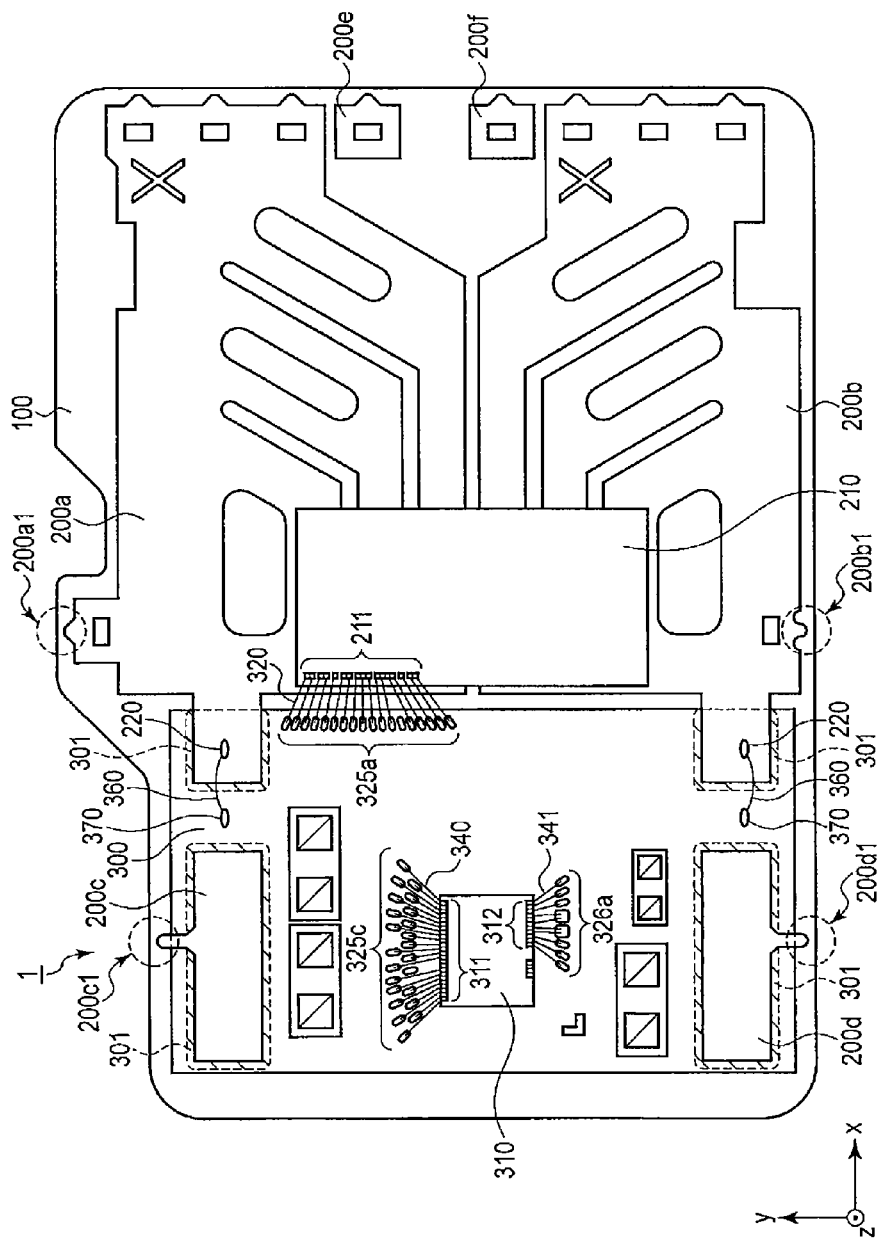
FIG. 13 is a diagram schematically showing a basic inner structure of a memory card of a fourth embodiment.

As shown in FIG. 13, bonding wires (which may simply be referred to as wires) 360 that connect a lead frame 200 and a circuit board 300 are provided. Specifically, the wires 360 connect connection pads 220 and through hole sections 370. Further, as shown in FIG. 14, the through hole sections 370 are electrically separated from respective interconnects. The wires 360 are formed for example of an Au material.

FIG. 15 is a diagram showing a connecting relationship of a memory chip 210 and a controller chip 310. As shown in FIG. 15, no through hole section is provided at the conductive section 325 connecting the memory chip 210 and the controller chip 310.

Figure 16:
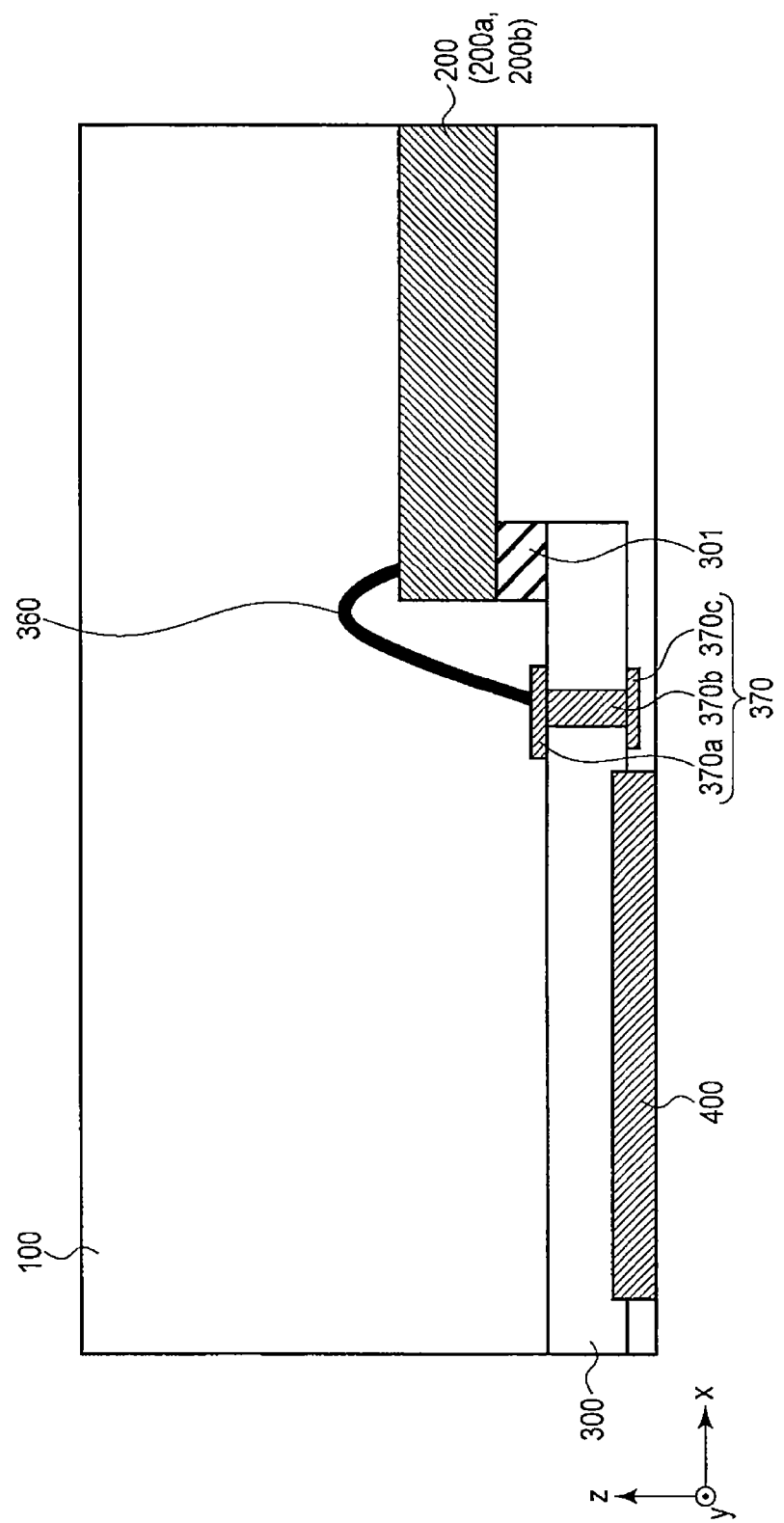
FIG. 16 is a cross sectional diagram schematically showing the basic structure of the memory card of the fourth embodiment.

FIG. 16 is a diagram showing a connecting relationship of the lead frame 200 and the through hole section 370. As shown in FIG. 16, a through hole penetrating an upper surface and a lower surface is formed on the circuit board 300, and an embedded section 370b formed of a metal material is embedded in this through hole. Further, an upper layer section (which may also be referred to as interconnect, pattern, or conductive section) 370a formed of a metal material is formed on the upper surface of the circuit board 300 and an upper surface of the embedded section 370b. Further, a lower layer section 370c formed of a metal material is formed on the lower surface of the circuit board 300 and a lower surface of the embedded section 370b. The lower layer section 370c is electrically connected to the embedded section 370b, and has its periphery surrounded by resin 100. A set of the upper layer section 370a, the embedded section 370b, and the lower layer section 370c will herein be termed a through hole section 370.

The upper surface of the upper layer section 370a is connected to the wire 360. That is, a connection pad 220 (not shown) of the lead frame 200 and the through hole section 370 of the circuit board 300 are electrically connected by the wire 360.

<Operation Upon Surge Intrusion>

Figure 17:
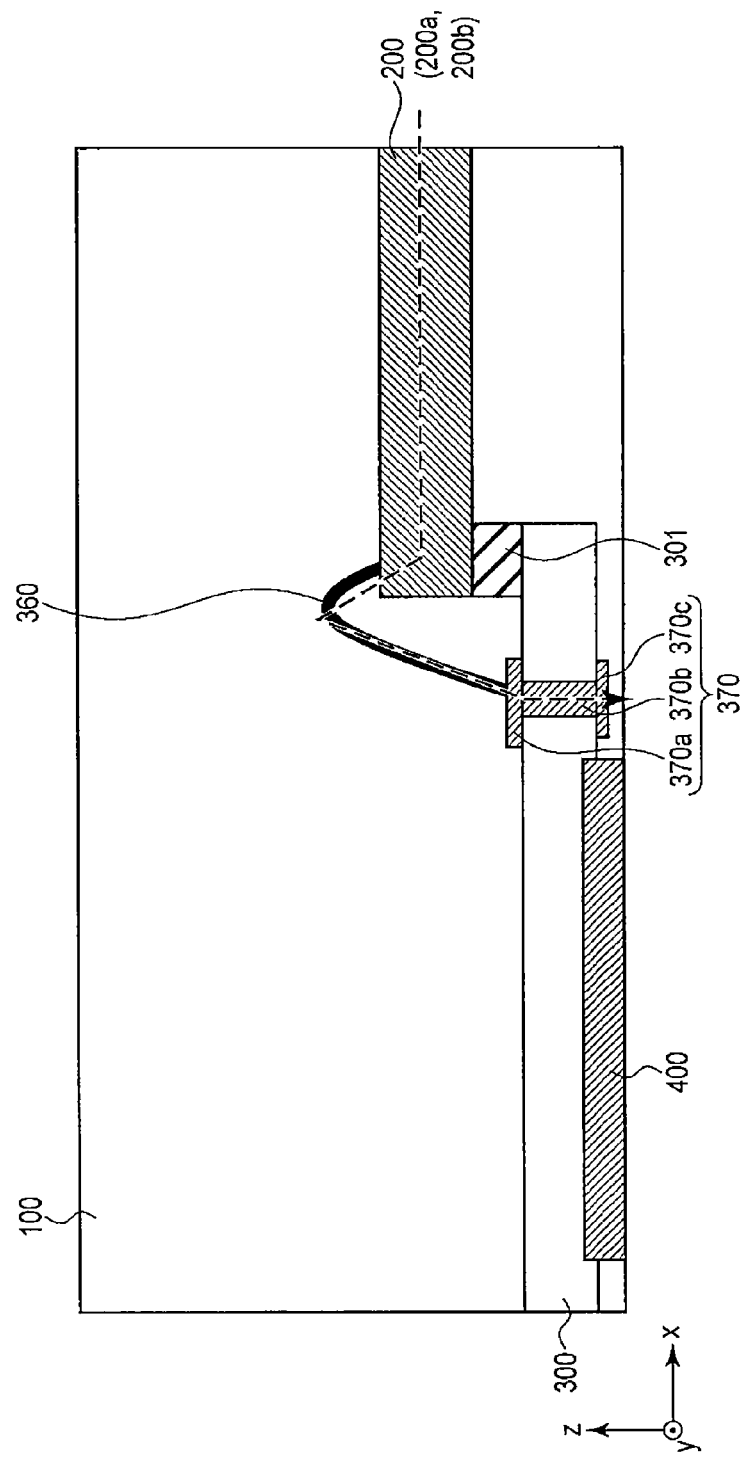
FIG. 17 is a cross sectional diagram schematically showing the basic structure of the memory card of the fourth embodiment.

Next, an operation in a case where a surge from outside intrudes into a memory card 1 will be explained with reference to FIG. 17. The surge from outside may intrude for example from the lead frame 200 to the inside of the memory card 1. Since the surge flows toward a portion with a lower resistance, it flows into the through hole section 370 in which metal is embedded with priority (refer to a broken lined arrow in the drawing). Due to this, the intrusion of the surge into the memory chip 210 can be suppressed.

<Working and Advantageous Effects of Third Embodiment>

According to the above described third embodiment, the memory card 1 is provided with the memory chip 210 including a storage circuit, and the controller chip 310 that controls the memory chip 210. Further, the memory card 1 is provided with the circuit board 300 having the first surface and the second surface opposing one another, on the first surface of which the controller chip 310 is mounted, and the metal plate 200 on which the memory chip 210 is mounted, having only a part of which being connected to the first surface of the circuit board 300 via the adhering layer 301. Further, the memory card 1 is provided with the conductive through hole section that penetrates the first surface and the second surface of the circuit board 300, and the third wire having one end connected to the metal plate 200 and the other end connected to the through hole section.

By providing the through hole sections in which the metal is embedded, the surge that has intruded into the lead frame can be discharged to the through hole sections. Due to this, the surge that may damage the memory chip can be reduced similar to the second embodiment, and resistivity of the memory card against the ESD (electrostatic discharge damage) can be improved.

(First Variant of Third Embodiment)

Next, the first variant of the third embodiment will be explained. Note that, a basic configuration and a basic operation are similar to those of the above described first and third embodiments. Thus, explanations on matters explained in the above described first and third embodiments and matters that can easily be assumed from the above described first and third embodiments will be omitted. The first variant differs from the above described third embodiment in that an adhering layer between a lead frame and a circuit board is made of a conductive material, and above described through holes are provided at connecting points of the lead frame and the circuit board.

<Structure of Memory Card of First Variant of Third Embodiment>

Figure 18:
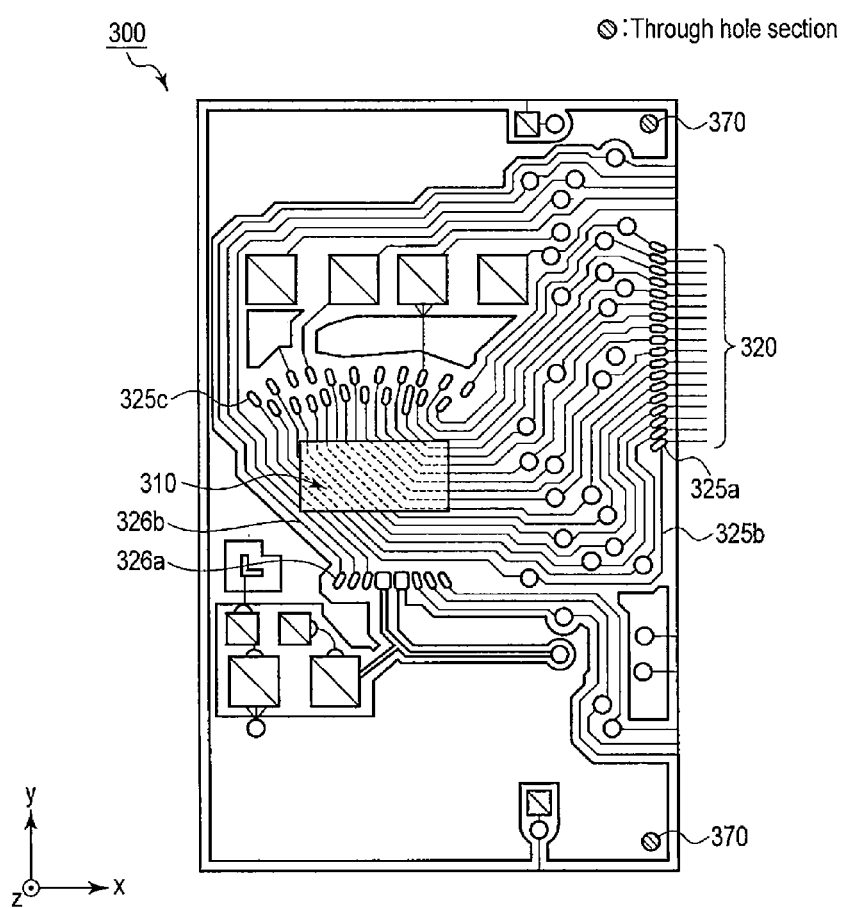
FIG. 18 is a diagram schematically showing a basic interconnect structure of a substrate of a memory card of a first variant of the fourth embodiment.

As shown in FIG. 18, above described through hole sections 370 are disposed at regions where a lead frame 200 and a circuit board 300 are adhered.

Figure 19:
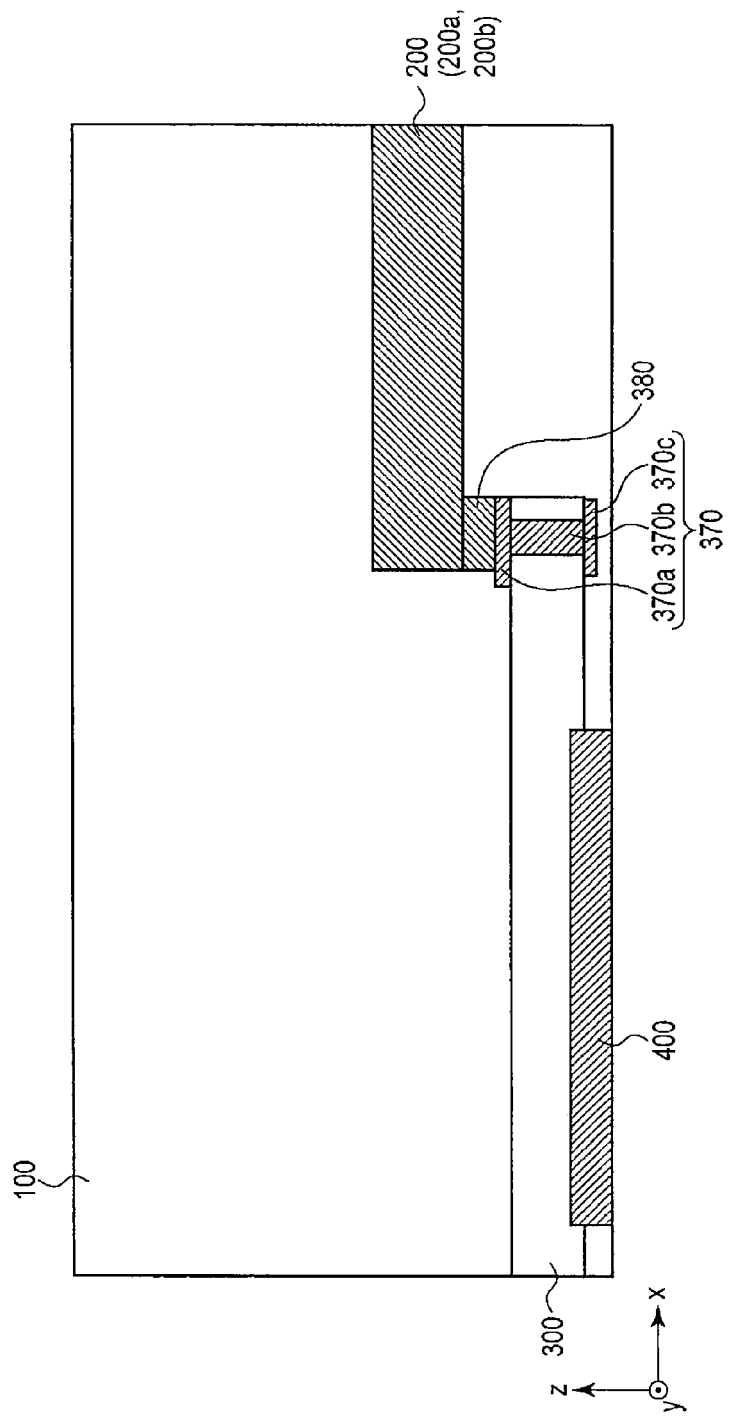
FIG. 19 is a cross sectional diagram schematically showing a basic structure of the memory card of the first variant of the fourth embodiment.

As shown in FIG. 19, as an adhering layer 380 between the lead frame 200 and the circuit board 300, a conductive material is used. An upper surface of an upper layer section 370a is connected to the conductive adhering layer 380. That is, the lead frame 200 and the through hole section 370 of the circuit board 300 are electrically connected by the adhering layer 380. For example, a film thickness of this adhering layer 380 and an upper layer section 370a is about the same as that of an adhering layer 301 explained above.

<Operation Upon Surge Intrusion>

Figure 20:
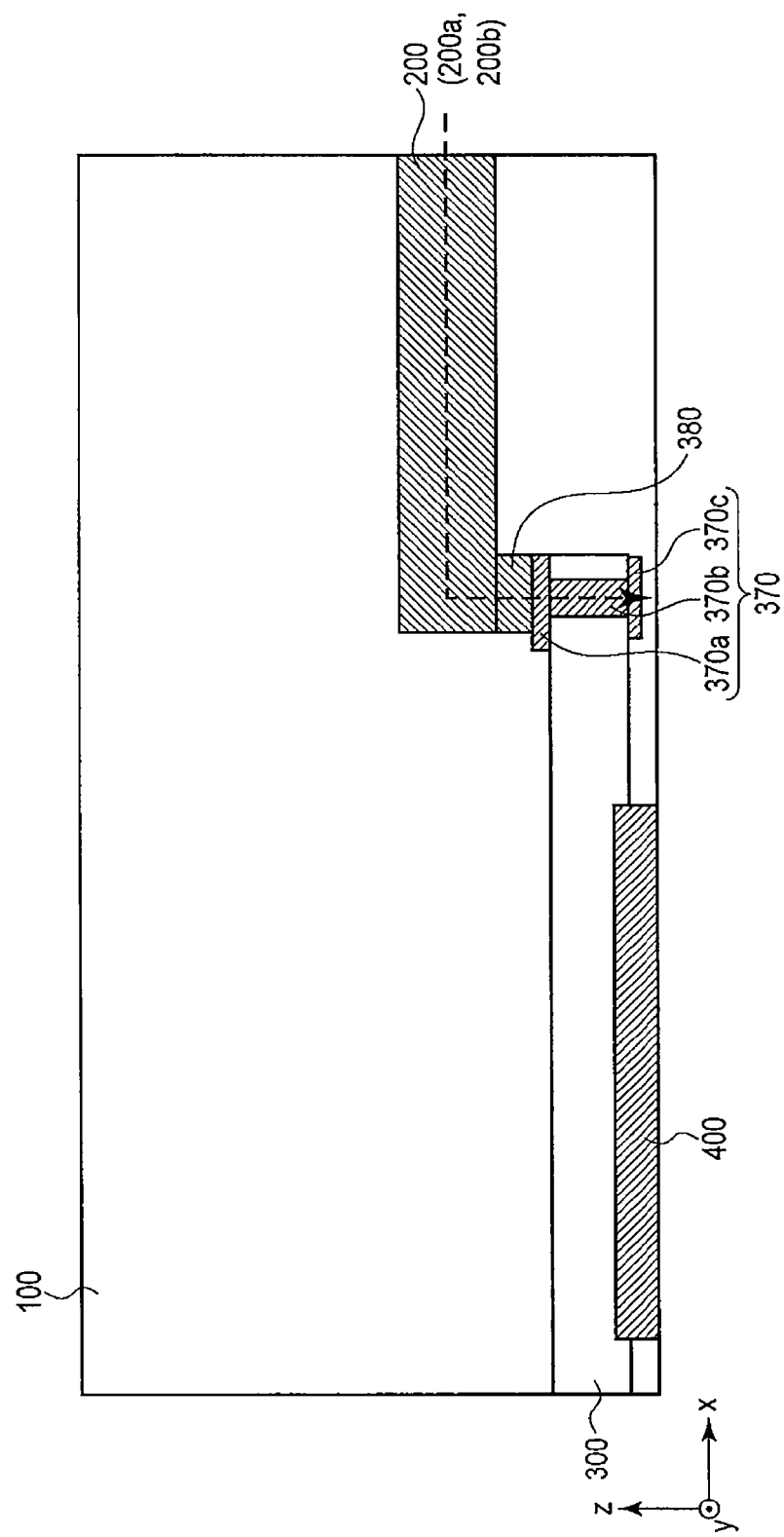
FIG. 20 is a cross sectional diagram schematically showing the basic structure of the memory card of the first variant of the fourth embodiment.

Next, an operation in a case where a surge from outside intrudes into a memory card 1 will be explained with reference to FIG. 20. The surge from outside that intrudes from the lead frame 200 to the inside of the memory card 1 flows into the through hole section 370 in which metal is embedded with priority via the adhering layer 380 (refer to a broken lined arrow in the drawing). Due to this, the intrusion and the like of the surge into a memory chip 210 can be suppressed.

<Working and Advantageous Effects of First Variant of Third Embodiment>

According to the above described first variant, the memory card 1 is provided with the memory chip 210 including a storage circuit, and the controller chip 310 that controls the memory chip 210. Further, the memory card 1 is provided with the circuit board 300 having the first surface and the second surface opposing one another, on the first surface of which the controller chip 310 is mounted, and the conductive through hole section 370 that penetrates the first surface and the second surface of the circuit board 300. Further, the memory card 1 is provided with the metal plate 200 on which the memory chip 210 is mounted, and which is electrically connected to the through hole section 370 via the conductive adhering layer 380. Due to this, similar effects as those of the above described third embodiment can be obtained.

(Second Variant of Third Embodiment)

Next, the second variant of the third embodiment will be explained. Note that, a basic configuration and a basic operation are similar to those of the above described first and third embodiments and first variant. Thus, explanations on matters explained in the above described first and third embodiments and first variant and matters that can easily be assumed from the above described first and third embodiments and first variant will be omitted. The second variant differs from the above described third embodiment and first variant in that an adhering layer between a lead frame and a circuit board is made of a conductive material, above described through holes are provided at connecting points of the lead frame and the circuit board, and wires that connect the lead frame and the through holes are provided.

<Structure of Memory Card of Second Variant of Third Embodiment>

Figure 21:
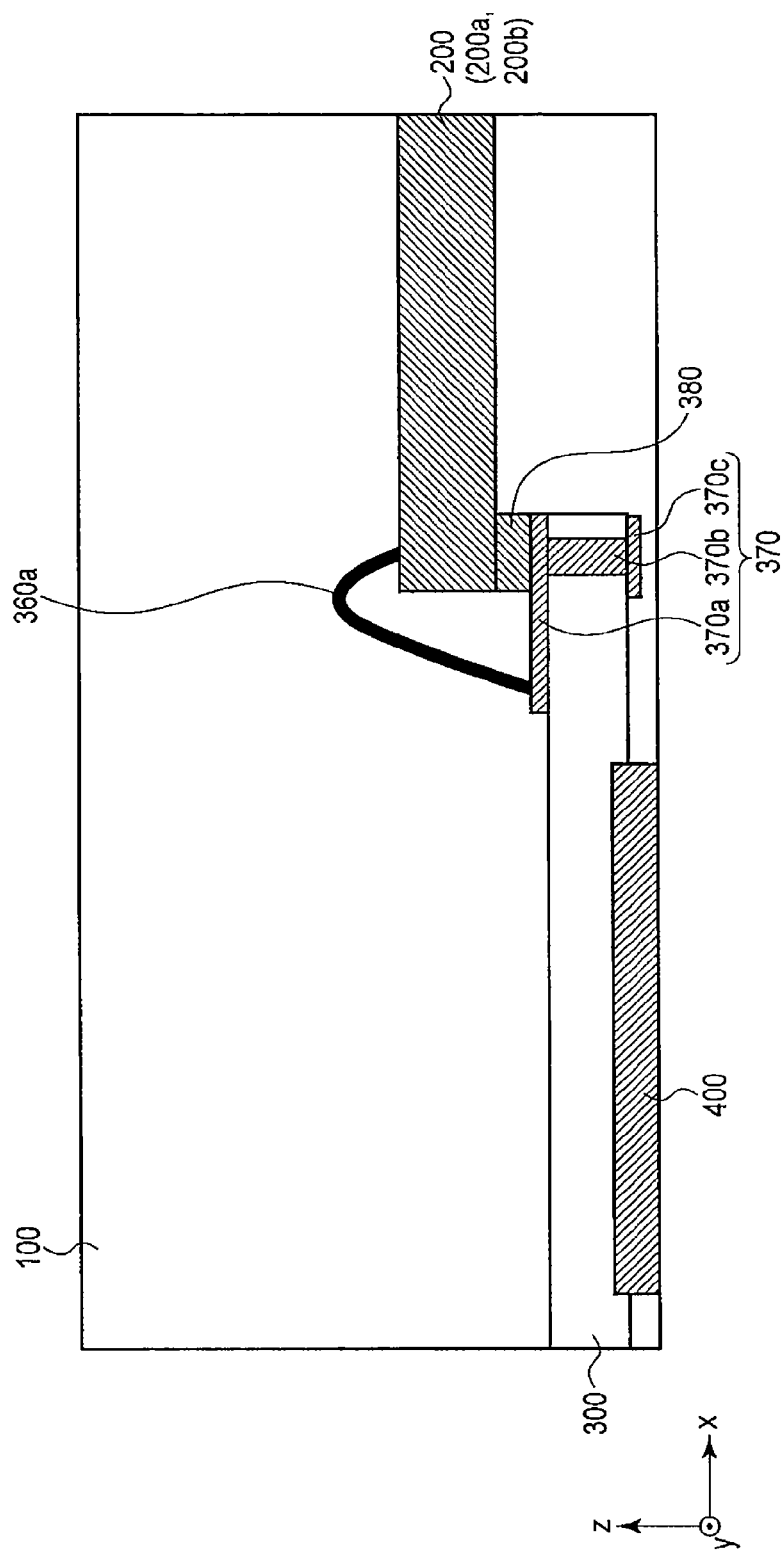
FIG. 21 is a cross sectional diagram schematically showing a basic structure of a memory card of a second variant of the fourth embodiment.

As shown in FIG. 21, in a configuration explained in FIG. 19, a bonding wire formed of an Au material (which may simply be referred to as wires) 360a connects a lead frame 200 and a through hole section 370. Specifically, a connection pad 220 (not shown) of the lead frame 200 and an upper layer section 370a is connected by the wire 360a. At this occasion, the upper layer section 370a may be expanded in an x axis direction so that the wire 360a can more easily connect with the upper layer section 370a.

<Operation Upon Surge Intrusion>

Figure 22:
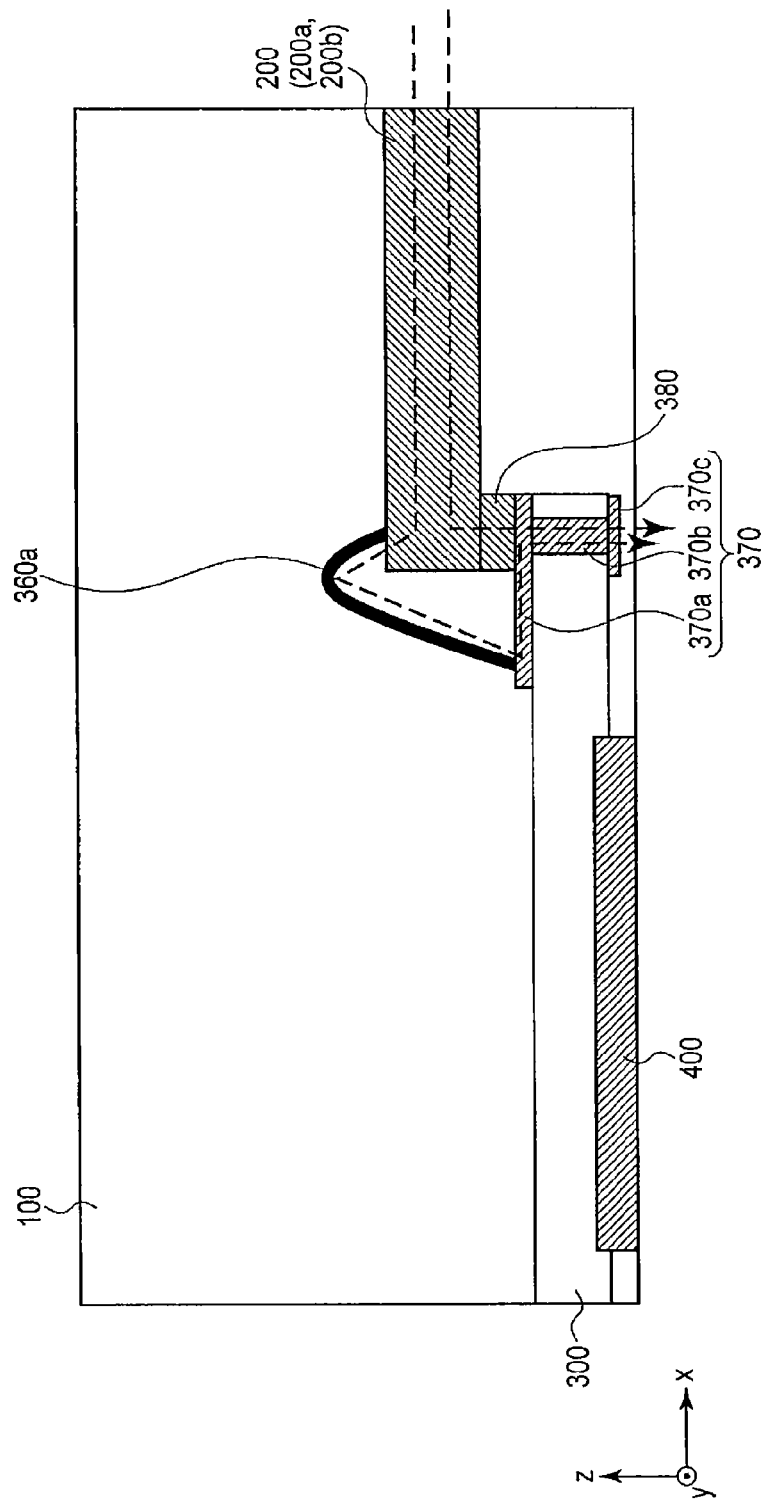
FIG. 22 is a cross sectional diagram schematically showing the basic structure of the memory card of the second variant of the fourth embodiment.

Next, an operation in a case where a surge from outside intrudes into a memory card 1 will be explained with reference to FIG. 22. Since the surge flows to the through hole section through two paths as explained in the above described third embodiment and first variant (refer to broken lined arrows in the drawing), the intrusion and the like of the surge into a memory chip 210 can further be suppressed.

Fourth Embodiment

Next, the fourth embodiment will be explained. Note that, a basic configuration and a basic operation are similar to those of the above described second embodiment. Thus, explanations on matters explained in the above described second embodiment and matters that can easily be assumed from the above described second embodiment will be omitted. The fourth embodiment differs from the above described second embodiment in further including a lightning conductor wire that crosses over wires connecting a memory chip and a circuit board.

<Structure of Memory Card of Fourth Embodiment>

As shown in FIG. 23, a bonding wire (which may simply be referred to as a wire) 391 that connects a lead frame 200 and a circuit board 300 and crosses over wires 320 along a z direction is provided.

Specifically, the wire 391 connects a connection pad 230 and a through hole section (floating potential) 390. This wire 391 is for example formed of an Au material. Further, conductive sections 325 connecting a memory chip 210 and a controller chip 310 are not provided with through hole sections.

Next, a positional relationship of the wire 391 and wires 320 and 340 will be explained with reference to FIG. 24. Since FIG. 24 is a diagram for explaining the positional relationship of the each of the wires, arrangements, size and the like of respective portions is shown schematically. FIG. 23 should be referenced for more accurate arrangement and the like of the respective portions.

As shown in FIG. 24, a through hole penetrating from an upper surface to a lower surface is formed on the circuit board 300, and an embedded section 390b formed of a metal material is embedded in this through hole. Further, an upper layer section 390a formed of a metal material is formed on the upper surface of the circuit board 300 and an upper surface of the embedded section 390b. Further, a lower layer section 390c formed of a metal material is formed on the lower surface of the circuit board 300 and a lower surface of the embedded section 390b. The lower layer section 390c is electrically connected to the embedded section 390b, and is insulated by resin 100. A set of the upper layer section 390a, the embedded section 390b and the lower layer section 390c will herein be termed a through hole section 390.

An upper surface of the upper layer section 390a is connected to the wire 391. Further, the wire 391 is connected to the connection pad 230 (not shown) of the lead frame 200. That is, the lead frame 200 and the through hole section 390 are electrically connected by the wire 391. Further, a height H3 of the wire 391 in the z direction is higher than a height H1 of the wire 340, and further is higher than a height H2 of the wire 320. Further, the wire 391 herein crosses over the wire 320.

<Operation Upon Surge Intrusion>

Figure 25:
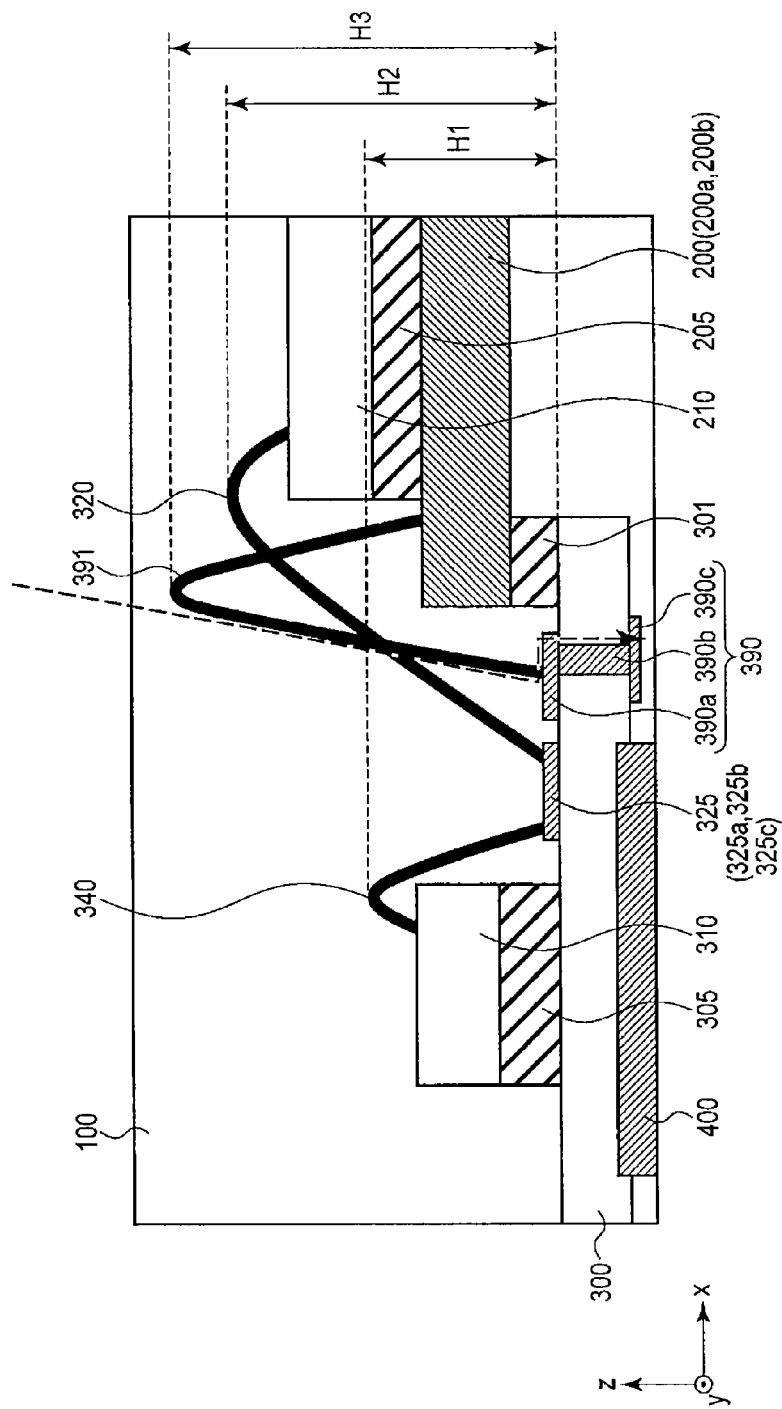
FIG. 25 is a cross sectional diagram schematically showing the basic structure of the memory card of the fifth embodiment.

As shown in FIG. 25, a surge from outside tends to intrude into a conductive material having a close distance from an outside of the resin 100. Due to this, for example, the surge intrudes from the wire 320 to an inside of the memory card 1. At this occasion, since the wire 391 that is to be the lightning conductor for inducing the surge is provided, the surge intrudes into the wire 391. Further, since the through hole section 390 in which metal is embedded is provided, the surge flows into the through hole section 390 with priority (refer to a broken lined arrow in the drawing). Due to this, a drastic voltage application on the memory chip 210 and the controller chip 310 caused by the surge can be suppressed.

<Working and Advantageous Effects of Fourth Embodiment>

According to the above described embodiment, the memory card 1 is provided with the memory chip 210 including a storage circuit, and the controller chip 310 that controls the memory chip 210. Further, the memory card 1 is provided with the circuit board 300 having the first surface and the second surface opposing one another, on the first surface of which the controller chip 310 is mounted, and a first interconnect 325 formed on the first surface of the circuit board 300. Further, the memory card 1 is provided with the first wire 320 having one end connected to the memory chip 210 and the other end connected to the first interconnect 325, the second wire 340 having one end connected to the controller chip 310 and the other end connected to the first interconnect 325, and the third wire 391 that is higher than the height of the first wire 320, crosses over the first wire 320, and is electrically separated from the memory chip and the controller chip. Further, the memory card 1 is further provided with the metal plate 200 on which the memory chip 210 is mounted, having a part of which connected to the first surface of the circuit board 300 via an adhering layer 301, and the conductive through hole section 390 penetrating the first surface and the second surface of the circuit board 300. Further, the third wire 391 has the one end connected to the metal plate 200, and the other end connected to the through hole section 390 provided on the circuit board 300.

The wire that is to be the lightning conductor covering the wires between the memory chip and the controller chip is provided. Since the surge tends to flow to the wire that is to be the lightning conductor, the surge that may damage the memory chip or the controller chip can be reduced, and resistivity of the memory card against ESD can be improved. Further, by providing the through hole section in which the metal is embedded at one end of the wire that is to be the lightning conductor, the surge that had intruded into the wire can be discharged to the through hole section.

(First Variant of Fourth Embodiment)

Next the first variant of the fourth embodiment will be explained. Note that, a basic configuration and a basic operation are similar to those of the above described fourth embodiment. Thus, explanations on matters explained in the above described fourth embodiment and matters that can easily be assumed from the above described fourth embodiment will be omitted. The first variant differs from the above described fourth embodiment in that a lightning conductor wire that crosses over wires connecting a memory chip and a circuit board is connected to the circuit board and the circuit board.

<Structure of Memory Card of First Variant of Fourth Embodiment>

Figure 26:
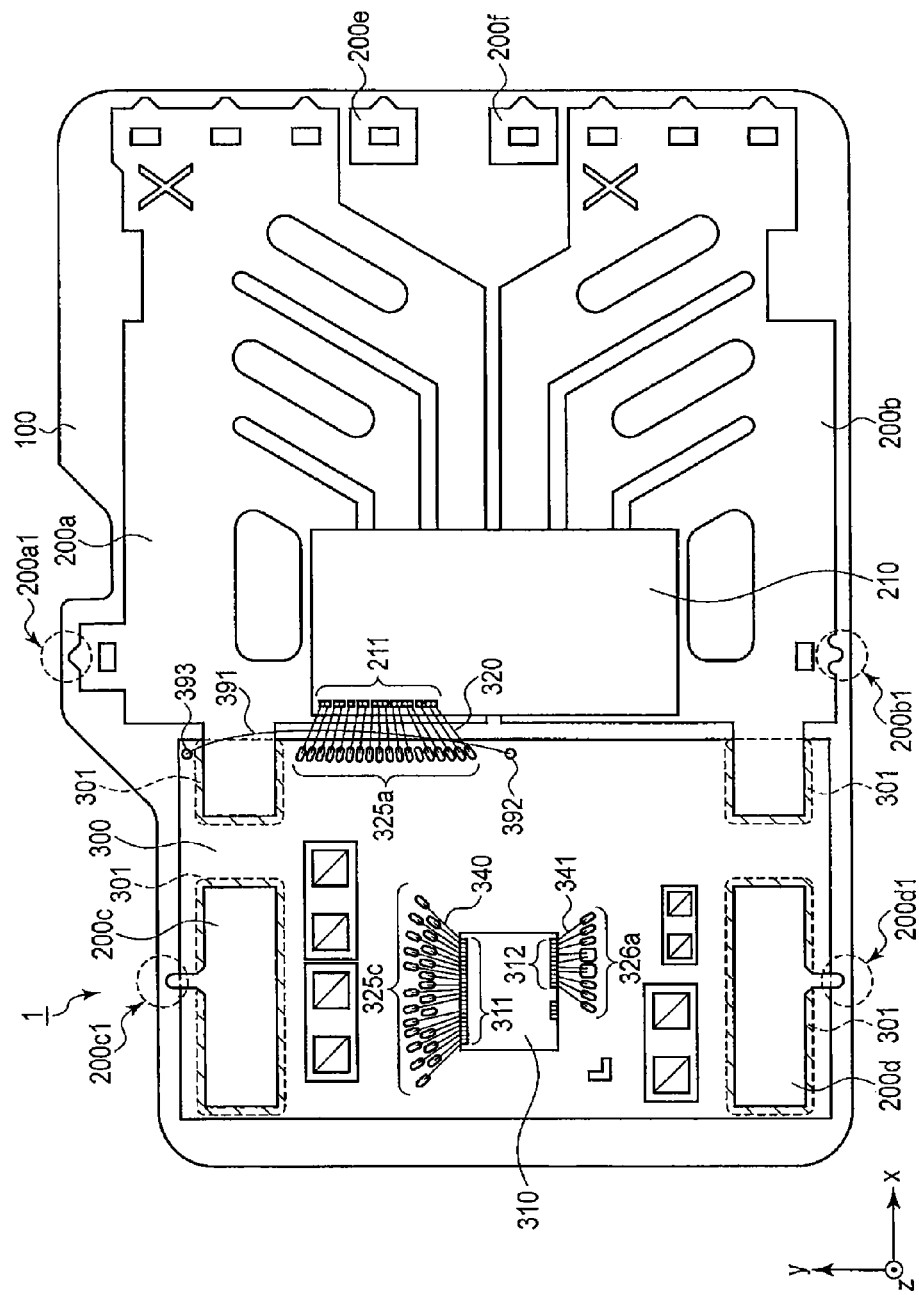
FIG. 26 is a diagram schematically showing a basic structure of a memory card of a first variant of the fifth embodiment.

As shown in FIG. 26, a lightning conductor wire 391 connects a conductive section 392 and a conductive section 393 of a circuit board 300, and is provided to cross over wires 320 along a z direction. In this case, each of the conductive sections 392 and 393 may be a through hole section (floating interconnect) as explained above, or may not have a through hole section formed thereat, and may be connected to a reference potential (ground interconnect).

<Working and Advantageous Effects of First Variant of Fourth Embodiment>

According to the above described first variant of the fourth embodiment, in a memory card 1, the fourth wire 391 may have one end connected to the first conductive section 392 of the circuit board 300 to which a first potential is given, and the other end connected to the second conductive section 393 of the circuit board.

Due to this, similar effects as explained in the fourth embodiment can be obtained.

(Second Variant of Fourth Embodiment)

Next, the second variant of the fourth embodiment will be explained. Note that a basic configuration and a basic operation are similar to the above described fourth embodiment and first variant of the fourth embodiment. Thus, explanations on matters explained in the fourth embodiment and first variant of the fourth embodiment and matters that can easily be assumed from the above described fourth embodiment and first variant of the fourth embodiment will be omitted. The second variant of the fourth embodiment differs from the above described fourth embodiment and first variant of the fourth embodiment in that a lightning conductor wire that crosses over wires connecting a controller chip and a circuit board is connected to the circuit board and the circuit board.

<Structure of Memory Card of Second Variant of Fourth Embodiment>

As shown in FIG. 27, a lightning conductor wire 391 connects a conductive section 394 and a conductive section 395 of a circuit board 300, and is provided to cross over wires 340 along a z direction. In this case, each of the conductive sections 394 and 395 may be a through hole section as explained above, or may not have a through hole section formed thereat, and may be connected to a reference potential.

Note that, although a through hole section 330 is not formed in conductive sections 325 that connect a memory chip 210 and a controller chip 310 in the above described third embodiment, respective variants of the third embodiment, fourth embodiment, and respective variants of the fourth embodiment, the through hole section 330 may be provided similar to the above described second embodiment. In such a case, ESD resistivity is further improved.

Further, although the through hole section 330 is not provided in the conductive sections 325 that connect the memory chip 210 and the controller chip 310 in the above described fourth embodiment and respective variants of the fourth embodiment, the through hole section 330 may be provided similar to the above described second embodiment. In such a case, the ESD resistivity is further improved.

Further, although no through hole section 370 is provided in portions where a lead frame 200 and a circuit board 300 are electrically connected in the above described fourth embodiment and respective variants of the fourth embodiment, the through hole section 370 may be provided similar to the above described third embodiment. In such a case, the ESD resistivity is further improved.

Further, by combining the above described fourth embodiment and respective variants of the fourth embodiment, the ESD resistivity is further improved.

Although cases in which wires 320 have a higher height than wires 340 were explained in the above described second embodiment and fourth embodiment, no limitation is made hereof, and a height of the wires 340 may be higher than the wires 320.

It is preferable that the lightning conductor wire 391 explained in the fourth embodiment crosses over all of the wires 320. Further in addition, the ESD resistivity is further improved by making the wire 391 cross over all of the wires 340.

Further, since the wire 391 explained in the fourth embodiment simply needs to serve a role as a lightning conductor that receives the surge; thus, if its one end and other end are not to be disposed on the lead frame, an arranging position of the wire 391 is not limited. Further, a plurality of this wire 391 may be provided. In this case, heights of each of the wires 391 may differ from one another. Further, the height of the wire 391 is preferably higher than other wires.

Note that, although a shape and size of the through hole (opening section) in the above described respective embodiments are not defined, such may be modified appropriately.

Since it is preferable for the above described through hole section to have a low resistance as possible so to be an escape route for the surge, larger amount of the metal material to be embedded in the through hole is more preferable.

Further, although the memory chip and the controller chip are connected by bonding wires, no limitation is made hereof, and the above described respective embodiments and respective variants can be adapted even to a case where the memory chip and the controller chip are connected by interconnects inside a circuit.

Further, although the above described respective embodiments and respective variants explained the memory card, no limitation is made hereof, and the above described respective embodiments and respective variants can be adapted to any device so long as a problem in the device resides in the ESD resistivity.

Fifth Embodiment

Next, a memory card of the fifth embodiment will be explained. In the fifth embodiment, a lead frame shape of the memory card will be explained. Here, the memory card using a lead frame will be explained. Note that a basic configuration and a basic operation are similar to the above described respective embodiments. Thus, explanations on matters explained in the above described respective embodiments and matters that can easily be assumed from the above described respective embodiments will be omitted.

<Inner Structure of Memory Card>

A basic inner structure of an example of the memory card of the fifth embodiment will schematically be explained with reference to FIG. 28. FIG. 28 is a planar diagram schematically showing the basic inner structure of the memory card of the fifth embodiment. As shown in FIG. 28, a memory card 2 includes mold resin (resin) 100, a lead frame 500, a memory chip 510, a controller chip 520, and a passive component 530.

The resin 100 is formed of an insulating material, and encapsulates the lead frame 500 so as to cover the same.

The lead frame 500 is for example a metal plate, and is divided into a plurality of plates. A plurality of lead frames 500 is electrically separated from one another by the resin 100 that is an insulator. Note that, although the lead frames 500 are leads (conductive plates) that are electrically separated individually, in a manufacturing process, they are described as a lead frame for the sake of convenience, since they are divided from a lead frame that is originally an integral component.

The memory chip 510 is disposed on the lead frame 500 via an adhering layer (not shown). Further, the controller chip 520 is disposed on the lead frame 500. A plurality of external connection terminals 600 is arranged on a lower surface of the lead frame 500. Further, the external connection terminals 600 are connected to the controller chip 520 via conductive boding wires (which may simply be referred to as wires) 550.

Any type of memory chip may be used as the memory chip 510. Further, a plurality of connection pads that is electrically connected to a circuit inside the memory chip 510 is provided on an upper surface of the memory chip 510, and the connection pads are electrically connected to the controller chip 520 via conductive bonding wires (which may simply be referred to as wires).

The controller chip 520 is for controlling operations of the memory chip 510. Specifically, it performs writing data to the memory chip 510, reading data from the memory chip 510, erasing data of the memory chip 510 and the like in accordance with commands from outside, and manages storage states of data in the memory chip 510. Further, the controller chip 520 may include a host interface, an MPU, a ROM, a RAM, a memory interface and the like. Further, a plurality of connection pads that is electrically connected with a circuit inside the controller chip 520 is provided on an upper surface of the controller chip 520, and the connection pads are electrically connected to the memory chip 510 via conductive bonding wires (which may simply be referred to as wires).

The passive component 530 is disposed on one end in an opposite direction from a direction of insertion of a memory card 2.

Further, the plurality of lead frames 500 is retained by tapes 540 so that they will not be unraveled prior to being encapsulated by the resin 100.

Figure 29:
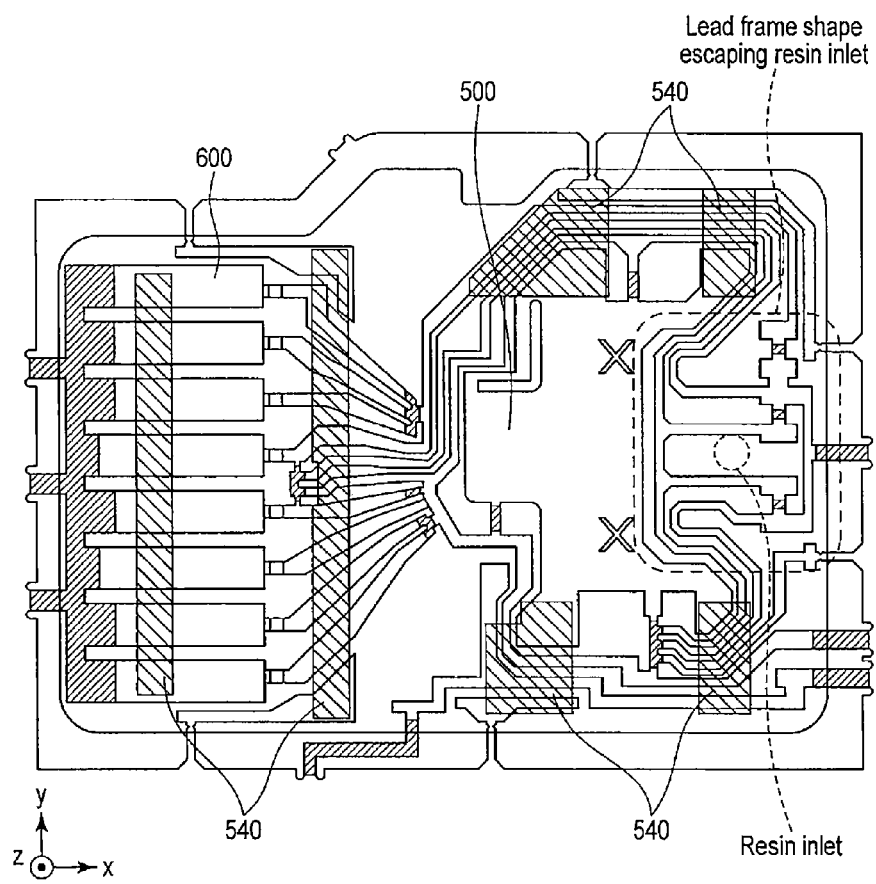
FIG. 29 is a planar diagram schematically showing a basic structure of a lead frame of the memory card of the fifth embodiment.

Next, a basic structure of the lead frames of a memory card of the fifth embodiment will schematically be explained with reference to FIG. 29. FIG. 29 is a planar diagram schematically showing the basic structure of the lead frame of the memory card of the fifth embodiment.

As shown in FIG. 29, a shape of the lead frame on the one end side that is opposite to an end to be inserted in an external device is disposed so as not to be positioned in the vicinity of a resin inlet of a dire that is used for molding. The lead frame at a region where the resin is to be inserted preferably has a sufficiently large gap than the resin inlet.

Next, a method of injecting the resin will schematically be explained.

For example, in a case where the memory card 2 includes the lead frame 500, the controller chip 520, the memory chip 510, the passive component 530 and the like are mounted on the lead frame 500. Thereafter, the lead frame 500 is disposed in the die (not shown). Then, the resin inlet is disposed on the side of the one end where the external connection terminals and the like of the lead frame are provided and that is opposite to the end to be inserted in the external device. Then, the resin 100 is poured into inside of the die from a non-terminal surface side of the memory card 2 through the resin inlet. Due to this, the lead frame 500, the controller chip 520, the memory chip 510, the passive component 530 and the like are encapsulated.

According to this, the resin is more easily provided to a terminal surface side of the lead frame, and a flow balance of the resin inside the molding die is improved.

Note that, of slash-marked regions in the drawing, regions at tip ends of the external connection terminal 600 are cut off prior to the injection process of the resin 100. Other slash-marked regions are cut off after the resin injection. Accordingly, the lead frame is divided into the plurality of lead frames by cutting the slash-marked regions apart.

Note that, the memory card 2 herein anticipates being individually encapsulated on one by one basis.

<Working Effect of Fifth Embodiment>

According to the semiconductor storage device of the above described embodiment, it includes the memory chip 510 including a storage circuit, the controller chip 520 that controls the memory chip 510, and the lead frame 500 including the first surface and the second surface opposing one another, on the first surface of which the memory chip 510 and the controller chip 520 are mounted. Further, the semiconductor storage device includes the external connection terminal 600 formed on the second surface of the lead frame 500, and the resin 100 that encapsulates the memory chip 510, the controller chip 520, and the lead frame 500 by being injected into the die that retains the lead frame 500. The lead frame 500 has the shape that escapes the vicinity of the region where the resin 100 is to be injected. In the semiconductor storage device, a shape of the resin inlet that injects the resin 100 is formed on the fifth surface of the resin 100.

In a case where the lead frame is disposed in the vicinity of the resin inlet, the injected resin and the lead frame interferes with one another, whereby the lead frame being warped, a position of the lead frame being disposed and the like may occur. More specifically, in the case where the lead frame is disposed in the vicinity of the resin inlet, there were cases in which the lead frame is pushed down toward a resin injecting direction by the resin upon molding, and is warped thereby.

However, in the present embodiment, since the lead frame has the sufficiently large gap provided in the vicinity of the region where the resin inlet is positioned, the resin is injected in the sufficiently large gap of the lead frame. Due to this, the flow balance of the resin upon molding is improved, and positional displacement and warping of the lead frame are improved. Further, for example, in a case of having a shape in which the lead frame cannot be provided in the vicinity of the region where the resin inlet is positioned, the resin is inserted into the gap that is larger than the resin inlet. The flow balance of the resin upon molding is further improved, and the positional displacement and the warping of the lead frame can further be improved.

Note that, the above described respective embodiments may be combined.

Further, although the fifth embodiment described a memory card using only the lead frame, no limitation is necessarily made hereof, and application to a memory card including a circuit board is also possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a memory chip including a storage circuit;
a controller chip that controls the memory chip;
a circuit board including a first surface and a second surface opposing one another, on the first surface of which the controller chip is mounted;
a first interconnect formed on the first surface of the circuit board;
a first wire having one end connected to the memory chip and the other end connected to the first interconnect;
a second wire having one end connected to the controller chip and the other end connected to the first interconnect;
a third wire having at least a portion thereof that is higher than any portion of the first wire, crosses over the first wire, and is electrically separated from the memory chip, the controller chip, and the first interconnect;
a metal plate on which the memory chip is mounted, and that has a part of which being connected to the first surface of the circuit board via an adhering layer; and
a conductive via plug that penetrates the first surface and the second surface of the circuit board;
wherein the third wire has one end connected to the metal plate and the other end connected to the conductive via plug provided in the circuit board.

2. The device of claim 1, further comprising a lower metal section on the second surface of the circuit board, the lower metal section being connected to the conductive via plug.

3. The device of claim 1, further comprising a housing formed of a resin that encapsulates the memory chip, the controller chip, the circuit board, and the metal plate.

4. The device of claim 3, wherein the housing includes a fifth surface and a sixth surface opposing one another, and includes a predetermined mark directly printed only on the sixth surface that is adjacent to the fourth surface of the metal plate.

5. A semiconductor storage device comprising:
a memory chip including a storage circuit;
a controller chip that controls the memory chip;
a circuit board including a first surface and a second surface opposing one another, on the first surface of which the controller chip is mounted;
a first interconnect formed on the first surface of the circuit board;
a first wire having one end connected to the memory chip and the other end connected to the first interconnect;
a second wire having one end connected to the controller chip and the other end connected to the first interconnect; and
a third wire having at least a portion thereof that is higher than any portion of the first wire, crosses over the first wire, and is electrically separated from the memory chip, the controller chip, and the first interconnect;
wherein the third wire has one end connected to a first conductive section of the circuit board to which a first potential is given, and the other end connected to a second conductive section of the circuit board.

6. A semiconductor storage device comprising:
a memory chip including a storage circuit;
a controller chip that controls the memory chip;
a circuit board including a first surface and a second surface opposing one another, on the first surface of which the controller chip is mounted;
a first interconnect formed on the first surface of the circuit board;
a first wire having one end connected to the memory chip and the other end connected to the first interconnect;
a second wire having one end connected to the controller chip and the other end connected to the first interconnect;
a third wire having at least a portion thereof that is higher than any portion of the first wire, crosses over the first wire, and is electrically separated from the memory chip, the controller chip, and the first interconnect; and
a housing formed of a resin that encapsulates the memory chip, the controller chip, and the circuit board.

* * * * *